(12) United States Patent
Albrecht et al.

(10) Patent No.: US 6,504,861 B2
(45) Date of Patent: *Jan. 7, 2003

(54) LASER GAS REPLENISHMENT METHOD

(75) Inventors: Hans-Stephan Albrecht, Goettingen (DE); Klaus Wolfgang Vogler, Goettingen (DE); Thomas Schroeder, Goettingen (DE)

(73) Assignee: Lambda Physik AG, Goettingen (DE)

(*) Notice: Subject to any disclaimer, the term of this patent is extended or adjusted under 35 U.S.C. 154(b) by 0 days.

This patent is subject to a terminal disclaimer.

(21) Appl. No.: 10/114,184

(22) Filed: Apr. 1, 2002

(65) Prior Publication Data

US 2002/0101901 A1 Aug. 1, 2002

Related U.S. Application Data

(60) Division of application No. 09/734,459, filed on Dec. 11, 2000, and a continuation-in-part of application No. 09/447,882, filed on Nov. 23, 1999.
(60) Provisional application No. 60/171,717, filed on Dec. 22, 1999, and provisional application No. 60/124,785, filed on Mar. 17, 1999.

(51) Int. Cl.$^7$ .................................................. H01S 3/22
(52) U.S. Cl. ........................................... 372/59; 372/58
(58) Field of Search ............................ 372/59, 60, 57, 372/55, 58

(56) References Cited

U.S. PATENT DOCUMENTS

| | | | |
|---|---|---|---|
| 3,899,750 A | 8/1975 | Hochuli et al. | 331/94.5 G |
| 4,009,933 A | 3/1977 | Firester | 350/152 |
| 4,240,044 A | 12/1980 | Fahlen et al. | 331/94.5 PE |

(List continued on next page.)

FOREIGN PATENT DOCUMENTS

| | | | | |
|---|---|---|---|---|
| DE | 32 12928 A1 | 10/1983 | | H01S/3/02 |
| DE | 44 01 892 | 7/1995 | | H01S/3/038 |
| DE | 295 20 280.1 | 12/1995 | | |

(List continued on next page.)

OTHER PUBLICATIONS

Joseph H. Eberly, "Superradiance Revisited," *American Journal of Physics*, vol. 40, No. 10, Oct. 1972, pp. 1374–1383.

T.Y. Chang, "Improved Uniform–Filed Electrode Profiles for TEA Laser and High–Voltage Applications," *The Review of Scientific Instruments*, Apr. 1973, vol. 44, No. 4, pp. 405–407.

Tennant et al., "Excimer Laser Chemical Problems," Tennant et al., "Excimer Laser Chemical Problems," *Los Almos National Laboratory Report*, 1982., pp. 1–81.

(List continued on next page.)

*Primary Examiner*—Leon Scott, Jr.
(74) *Attorney, Agent, or Firm*—Sierra Patent Group, Ltd.; Andrew V. Smith

(57) ABSTRACT

A method and apparatus is provided for stabilizing output beam parameters of a gas discharge laser by maintaining a constituent gas of the laser gas mixture at a predetermined partial pressure using a gas supply unit and a processor. The constituent gas of the laser gas mixture is provided at an initial partial pressure and the constituent gas is subject to depletion within the laser discharge chamber. Injections of the constituent gas are performed each to increase the partial pressure by a selected amount in the discharge chamber preferably less than 0.2 mbar per injection. A number of successive injections is performed at selected intervals to maintain the constituent gas substantially at the initial partial pressure for maintaining stable output beam parameters. The amount per injection and/or the interval between injections may be varied based on the measured value of the driving voltage and/or a calculated amount of the constituent gas in the discharge chamber. The driving voltage is determined to be in one of multiple driving voltage ranges that are adjusted based on the aging of the system. Within each range, gas injections and gas replacements are preferably performed based on total applied electrical energy to the discharge and/or alternatively, on time and/or pulse count.

23 Claims, 16 Drawing Sheets

U.S. PATENT DOCUMENTS

| | | | | |
|---|---|---|---|---|
| 4,380,079 A | 4/1983 | Cohn et al. | ............... | 372/87 |
| 4,393,505 A | 7/1983 | Fahlen | ............... | 372/57 |
| 4,399,540 A | 8/1983 | Buecher | ............... | 372/20 |
| 4,429,392 A | 1/1984 | Yoshida et al. | ............... | 372/9 |
| 4,534,034 A | 8/1985 | Hohla et al. | ............... | 372/59 |
| 4,611,270 A | 9/1986 | Klauminzer et al. | ............... | 364/183 |
| 4,616,908 A | 10/1986 | King | ............... | 350/576 |
| 4,674,099 A | 6/1987 | Turner | ............... | 372/59 |
| 4,686,682 A | 8/1987 | Haruta et al. | ............... | 372/87 |
| 4,691,322 A | 9/1987 | Nozue et al. | ............... | 372/82 |
| 4,716,569 A | 12/1987 | Bees | ............... | 372/38 |
| 4,719,637 A | 1/1988 | Cavaioli et al. | ............... | 372/59 |
| 4,722,090 A | 1/1988 | Haruta et al. | ............... | 372/57 |
| 4,740,982 A | 4/1988 | Hakuta et al. | ............... | 372/59 |
| 4,763,336 A | 8/1988 | Stephens | ............... | 372/81 |
| 4,829,536 A | 5/1989 | Kajiyama et al. | ............... | 372/57 |
| 4,856,018 A | 8/1989 | Nozue et al. | ............... | 372/98 |
| 4,860,300 A | 8/1989 | Baeumler et al. | ............... | 372/57 |
| 4,891,818 A | 1/1990 | Levatter | ............... | 372/57 |
| 4,905,243 A | 2/1990 | Lokai et al. | ............... | 372/32 |
| 4,926,428 A | 5/1990 | Kajiyama et al. | ............... | 372/20 |
| 4,953,174 A | 8/1990 | Eldridge et al. | ............... | 372/87 |
| 4,975,919 A | 12/1990 | Amada et al. | ............... | 372/33 |
| 4,977,573 A | 12/1990 | Bittenson et al. | ............... | 372/81 |
| 5,001,721 A | 3/1991 | Ludewig et al. | ............... | 372/59 |
| 5,005,181 A | 4/1991 | Yoshioka et al. | ............... | 372/59 |
| 5,025,445 A | 6/1991 | Anderson et al. | ............... | 372/20 |
| 5,081,635 A | 1/1992 | Wakabayashi et al. | ............... | 372/57 |
| 5,090,020 A | 2/1992 | Bedwell | ............... | 372/59 |
| 5,095,492 A | 3/1992 | Sandstorm | ............... | 372/102 |
| 5,097,291 A | 3/1992 | Suzuki | ............... | 355/69 |
| 5,099,491 A | 3/1992 | Chaffee | ............... | 372/59 |
| 5,111,473 A | 5/1992 | Rebhan et al. | ............... | 372/59 |
| 5,136,605 A | 8/1992 | Basting et al. | ............... | 372/59 |
| 5,140,600 A | 8/1992 | Rebhan | ............... | 372/25 |
| 5,142,543 A | 8/1992 | Wakabayashi et al. | ............... | 372/32 |
| 5,149,659 A | 9/1992 | Hakuta et al. | ............... | 436/55 |
| 5,150,370 A | 9/1992 | Furuya et al. | ............... | 372/106 |
| 5,221,823 A | 6/1993 | Usui | ............... | 219/121.78 |
| 5,226,050 A | 7/1993 | Burghardt | ............... | 372/20 |
| 5,243,614 A | 9/1993 | Wakata et al. | ............... | 372/29 |
| 5,247,531 A | 9/1993 | Mueller-Horsche | ............... | 372/38 |
| 5,247,534 A | 9/1993 | Mueller-Horsche | ............... | 372/58 |
| 5,247,535 A | 9/1993 | Mueller-Horsche et al. | ............... | 372/86 |
| 5,260,961 A | 11/1993 | Zhou et al. | ............... | 372/57 |
| 5,307,364 A | 4/1994 | Turner | ............... | 372/60 |
| 5,337,330 A | 8/1994 | Larson | ............... | 372/86 |
| 5,377,215 A | 12/1994 | Das et al. | ............... | 372/57 |
| 5,396,514 A | 3/1995 | Voss | ............... | 372/57 |
| 5,404,366 A | 4/1995 | Wakabayashi et al. | ............... | 372/29 |
| 5,405,207 A | 4/1995 | Zubli | ............... | 401/110 |
| 5,430,752 A | 7/1995 | Basting et al. | ............... | 372/59 |
| 5,440,578 A | 8/1995 | Sandstrom | ............... | 372/59 |
| 5,450,436 A | 9/1995 | Mizoguchi et al. | ............... | 372/59 |
| 5,463,650 A | 10/1995 | Ito et al. | ............... | 372/57 |
| 5,534,034 A | 7/1996 | Caspers | ............... | 623/32 |
| 5,535,233 A | 7/1996 | Mozoguchi et al. | ............... | 372/87 |
| 5,557,629 A | 9/1996 | Mozoguchi et al. | ............... | 372/87 |
| 5,559,584 A | 9/1996 | Miyaji et al. | ............... | 355/73 |
| 5,559,816 A | 9/1996 | Basting et al. | ............... | 372/27 |
| 5,586,134 A | 12/1996 | Das et al. | ............... | 372/38 |
| 5,596,596 A | 1/1997 | Wakabayashi et al. | ............... | 372/102 |
| 5,598,300 A | 1/1997 | Magnusson et al. | ............... | 359/566 |
| 5,642,374 A | 6/1997 | Wakabayashi et al. | ............... | 372/57 |
| 5,646,954 A | 7/1997 | Das et al. | ............... | 372/55 |
| 5,652,681 A | 7/1997 | Chen et al. | ............... | 359/831 |
| 5,659,419 A | 8/1997 | Lokai et al. | ............... | 359/330 |
| 5,659,531 A | 8/1997 | Ono et al. | ............... | 369/109 |
| 5,663,973 A | 9/1997 | Stamm et al. | ............... | 372/20 |
| 5,684,822 A | 11/1997 | Partlo | ............... | 372/95 |
| 5,710,787 A | 1/1998 | Amada et al. | ............... | 372/25 |
| 5,729,562 A | 3/1998 | Birx et al. | ............... | 372/38 |
| 5,729,565 A | 3/1998 | Meller et al. | ............... | 372/87 |
| 5,748,346 A | 5/1998 | David et al. | ............... | 359/15 |
| 5,754,579 A | 5/1998 | Mizoguchi et al. | ............... | 372/58 |
| 5,761,236 A | 6/1998 | Kleinschmidt et al. | ............... | 372/100 |
| 5,763,855 A | 6/1998 | Shioji | ............... | 219/121.84 |
| 5,771,258 A | 6/1998 | Morton et al. | ............... | 372/57 |
| 5,802,094 A | 9/1998 | Wakabayashi et al. | ............... | 372/57 |
| 5,811,753 A | 9/1998 | Weick et al. | ............... | 219/121.78 |
| 5,818,865 A | 10/1998 | Watson et al. | ............... | 372/86 |
| 5,835,520 A | 11/1998 | Das et al. | ............... | 372/57 |
| 5,852,627 A | 12/1998 | Ershov | ............... | 372/108 |
| 5,856,991 A | 1/1999 | Ershov | ............... | 372/57 |
| 5,887,014 A | 3/1999 | Das | ............... | 372/59 |
| 5,898,725 A | 4/1999 | Fomenkov et al. | ............... | 372/102 |
| 5,901,163 A | 5/1999 | Ershov | ............... | 372/20 |
| 5,914,974 A | 6/1999 | Partlo et al. | ............... | 372/38 |
| 5,917,849 A | 6/1999 | Ershov | ............... | 372/102 |
| 5,923,693 A | 7/1999 | Ohmi et al. | ............... | 372/57 |
| 5,936,988 A | 8/1999 | Partlo et al. | ............... | 372/38 |
| 5,940,421 A | 8/1999 | Partlo et al. | ............... | 372/38 |
| 5,946,337 A | 8/1999 | Govorkov et al. | ............... | 372/92 |
| 5,949,806 A | 9/1999 | Ness et al. | ............... | 372/38 |
| 5,970,082 A | 10/1999 | Ershov | ............... | 372/102 |
| 5,978,391 A | 11/1999 | Das et al. | ............... | 372/20 |
| 5,978,394 A | 11/1999 | Newman et al. | ............... | 372/32 |
| 5,978,405 A | 11/1999 | Juhasz et al. | ............... | 372/57 |
| 5,978,406 A | 11/1999 | Rokni et al. | ............... | 372/58 |
| 5,978,409 A | 11/1999 | Das et al. | ............... | 372/100 |
| 5,982,795 A | 11/1999 | Rothweil et al. | ............... | 372/38 |
| 5,982,800 A | 11/1999 | Ishihara et al. | ............... | 372/57 |
| 5,991,324 A | 11/1999 | Knowles et al. | ............... | 372/57 |
| 5,999,318 A | 12/1999 | Morton et al. | ............... | 359/572 |
| 6,005,879 A | 12/1999 | Sandstrom et al. | ............... | 372/25 |
| 6,005,880 A | 12/1999 | Basting et al. | ............... | 372/38 |
| 6,014,398 A | 1/2000 | Hofmann et al. | ............... | 372/60 |
| 6,018,537 A | 1/2000 | Hofmann et al. | ............... | 372/25 |
| 6,020,723 A | 2/2000 | Desor et al. | ............... | 320/166 |
| 6,028,872 A | 2/2000 | Partlo et al. | ............... | 372/38 |
| 6,028,880 A | 2/2000 | Carlesi et al. | ............... | 372/58 |
| 6,061,382 A | 5/2000 | Govorkov et al. | ............... | 372/101 |
| 6,081,542 A | 6/2000 | Scaggs | ............... | 372/70 |
| 6,084,897 A | 7/2000 | Wakabayashi et al. | ............... | 372/38 |
| 6,130,904 A | 10/2000 | Ishihara et al. | ............... | 372/59 |
| 6,151,346 A | 11/2000 | Partlo et al. | ............... | 372/38 |
| 6,151,350 A | 11/2000 | Komori et al. | ............... | 372/59 |
| 6,154,470 A | 11/2000 | Basting et al. | ............... | 372/19 |
| 6,157,662 A | 12/2000 | Scaggs et al. | ............... | 372/60 |
| 6,160,831 A | 12/2000 | Kleinschmidt et al. | ............... | 372/57 |
| 6,160,832 A | 12/2000 | Kleinschmidt et al. | ............... | 372/57 |
| 6,188,710 B1 | 2/2001 | Besaucele et al. | ............... | 372/60 |
| 6,243,405 B1 * | 6/2001 | Borneis et al. | ............... | 372/59 |
| 2001/0012309 A1 * | 8/2001 | Albrecht et al. | ............... | 372/59 |

FOREIGN PATENT DOCUMENTS

| | | | | |
|---|---|---|---|---|
| DE | 196 18 119 A1 | 11/1996 | ............... | H01S/3/134 |
| DE | 297 13 755 U1 | 11/1997 | ............... | H01S/3/03 |
| DE | 298 22 090.3 | 3/1999 | ............... | H01S/3/08 |
| EP | 0 459 503 A3 | 12/1991 | ............... | H01S/3/08 |
| EP | 0 459 503 A2 | 12/1991 | ............... | H01S/3/08 |
| EP | 0 532 751 A1 | 3/1993 | ............... | H01S/3/038 |
| EP | 0 532 751 B1 | 3/1993 | ............... | H01S/3/038 |
| EP | 1 075 060 A2 | 2/2001 | ............... | H01S/3/225 |
| EP | 1 091 462 A2 | 4/2001 | ............... | H01S/3/225 |
| JP | 61-91982 | 5/1986 | ............... | 3/3 |
| JP | 61-116889 | 6/1986 | ............... | H01S/3/04 |
| JP | 63-86593 A | 4/1988 | ............... | H01S/3/134 |
| JP | Hei 1-115182 | 5/1989 | ............... | H01S/3/134 |
| JP | 03-009582 | 1/1991 | ............... | 3/38 |
| JP | Hei 3-166784 | 7/1991 | ............... | H01S/3/134 |

| | | | | |
|---|---|---|---|---|
| JP | Hei 3-265180 | 11/1991 | ........... | H01S/3/097 |
| JP | Hei 4-17380 | 1/1992 | ........... | H01S/3/097 |
| JP | 06-250008 A | 9/1994 | | |
| JP | 10-341050 | 12/1998 | ........... | H01S/3/036 |
| WO | WO 99/19952 | 4/1999 | ............. | H01S/3/22 |

OTHER PUBLICATIONS

E.A. Stappaerts, "A Novel Analytical Design Method for Discharge Laser Electrode Profiles," *Applied Physics Letters*, Jun. 15, 1982, vol. 40, No. 12, pp. 1018–1019.

G.J. Ernst, "Compact Uniform Field Electrode Profiles," *Optics Communications*, Aug. 1, 1983, vol. 47, No. 1, pp. 47–51.

G.J. Ernst, "Uniform–Field Electrodes with Minimun Width," *Optics Communications*, vol. 49., No. 4., Mar. 15, 1984, pp. 275–277.

Marchetti et al., "A New Type of Corona–Discharge Photoionization Source for Gas Lasers," *Journal of Applied Physics*, Dec. 1, 1984; vol. 56., No. 11., pp. 3163–3168.

Ogura, S. et al., "Output Power Stabilization of a XeCl Excimer Laser," *Proceedings of SPIE: Gas and Metal Vapor Lasers and Applications*, Jan. 20–22, 1991., vol. 1412., pp. 123–128.

Golobic et al., Clinical Experience with an Excimer Laser Angioplasty System, *Proceedings of Diagnostic and Therapeutic Cardiovascular Interventions SPIE*, Jan. 20–22, 1991, vol. 1425., pp. 84–91.

Ujda, Z. et al., "Analysis of Possibility of Computer Control of the Parameters of an Excimer Laser Part II Results of Computerization of the Parameter of a XeCL Laser," *Journal of Technical Physics*, 1191, pp. 399–408.

Elliott et al., "Recent Advances in an Excimer Laser Source for Microlithography," *J.Vac. Sci. Technol.*, Nov./Dec. 1991., vol. 9., No. 6., pp. 3122–3125.

Basting et al., "Industrial Excimer Lasers Fundamentals," Technology and Maintenance, 1991, pp. 1–97.

Patent Abstracts of Japan, vol. 016, No. 312, Jul. 9, 1992 & JP 04 087388 A.

*Jurisch et al., Gas Contaminant Effects in Discharge–Excited KrF Lasers, Applied Optics, vol. 31., No. 12., Apr. 20, 1992, pp. 1975–1981.*

Press Release: Lambda Physik Highlights, Apr. 1993.

Turner et al., "Dependence of Excimer Laser Beam Properties on Laser Gas Composition," *SPIE*, 1993, vol. 1835., pp. 158–164.

Taylor et al., "Pre–preionization of a Long Optical Pulse Magnetic–Spiker Sustainer XeCL Laser," *Review of Scientific Instruments*, 1994, vol. 65., No. 12., pp. 3621–3627.

Pätzel et al., "KrF Excimer Laser with Repetition Rates of 1 kHz for DUV Lithography," *SPIE*, vol. 2440, pp. 101–105.

Patent Abstracts of Japan, Dec. 6, 1994, vol. 018, No. 642., (P–1838).

*D. Basting et al., "Laserrohr für halogenhaltige Gasentladungslaser" G 295 20 280.1, Jan. 25, 1995/Apr. 18, 1996.*

R.S. Taylor., "Transmission Properties of Spark Preionization Radiation in Rare–Gas Halide Laser Gas Mixes," *IEEE Journal of Quantum Mechanics of Quantum Mechanics*, Dec. 1995, vol. 31., No. 12., pp. 2195–2207.

Enami et al., "High Spectral Purity and High Durability kHz KrF Excimer Laser with Advanced RF Pre–Ionozation Discharge," *SPIE*, vol. 3334, pp. 1031–1040.

Kataoka et al., "Performance Improvement of a Discharge–pumped Arf Excimer Laser by Xenon Gas Addition," *Japanese Journal of Applied Physics, Part 1*, Dec. 1999., vol. 38., No. 12A., pp. 6735–6738.

Wakabayashi et al., "Billion Level Durable ArF Excimer Laser with Highly Stable Energy," *SPIE 24$^{th}$ Annual International Symposium on Microlithography*, May 14–19, 1999.

V.M. Borisov et al., "Effects Limiting the Average Power of Compact Pulse–Periodic KrF Lasers," *Quantum Electronics*, 1995, vol. 25, No. 5, pp. 421–425.

* cited by examiner

LASER GAS REPLENISHMENT METHOD

PRIORITY

This application is a 37 CFR 53(b) divisional application which claims the benefit of priority to U.S. patent application Ser. No. 09/734,459, filed Dec. 11, 2000, which claims the benefit of priority to United States provisional patent application No. 60/171,717, filed Dec. 22, 1999, and which is a Continuation-in-Part of U.S. patent application Ser. No. 09/447,882, filed Nov. 23, 1999, which claims the benefit of United States provisional patent application No. 60/124,785, filed Mar. 17, 1999, wherein the above applications are assigned to the same assignee as the present application and are hereby incorporated by reference.

BACKGROUND OF THE INVENTION

1. Field of the Invention

The present invention relates to a method and apparatus for stabilizing output beam parameters of a gas discharge laser. More particularly, the present invention relates to maintaining an optimal gas mixture composition over long, continuous operating or static periods using very small gas injections.

2. Discussion of the Related Art

Pulsed gas discharge lasers such as excimer and molecular lasers emitting in the deep ultraviolet (DUV) or vacuum ultraviolet (VUV) have become very important for industrial applications such as photolithography. Such lasers generally include a discharge chamber containing two or more gases such as a halogen and one or two rare gases. KrF (248 nm), ArF (193 nm), XeF (350 nm), KrCl (222 nm), XeCl (308 nm), and $F_2$ (157 nm) lasers are examples.

The efficiencies of excitation of the gas mixtures and various parameters of the output beams of these lasers vary sensitively with the compositions of their gas mixtures. An optimal gas mixture composition for a KrF laser has preferred gas mixture component ratios around 0.1% $F_2$/1% Kr/98.9% Ne (see U.S. Pat. No. 4,393,505, which is assigned to the same assignee and is hereby incorporated by reference). A $F_2$ laser may have a gas component ratio around 0.1% $F_2$/99.9% Ne or He or a combination thereof (see U.S. patent application Ser. No. 09/317,526, which is assigned to the same assignee and is hereby incorporated by reference).

Small amounts of Xe may be added to rare gas halide gas mixtures, as well (see U.S. patent application Ser. No. 60/160,126, which is assigned to the same assignee and is hereby incorporated by reference; see also R. S. Taylor and K. E. Leopold, *Transmission Properties of Spark Preionization Radiation in Rare-Gas Halide Laser Gas Mixes,* IEEE Journal of Quantum Electronics, pp. 2195–2207, vol. 31, no. 12 (Dec. 1995). Any deviation from the optimum gas compositions of these or other excimer or molecular lasers would typically result in instabilities or reductions from optimal of one or more output beam parameters such as beam energy, energy stability, temporal pulse width, temporal coherence, spatial coherence, discharge width, bandwidth, and long and short axial beam profiles and divergences.

Especially important in this regard is the concentration (or partial pressure) of the halogen, e.g., $F_2$, in the gas mixture. The depletion of the rare gases, e.g., Kr and Ne for a KrF laser, is low in comparison to that for the $F_2$. FIG. 1 shows laser output efficiency versus fluorine concentration for a KrF laser, showing a decreasing output efficiency away from a central maximum. FIG. 2 shows how the temporal pulse width (pulse length or duration) of KrF laser pulses decrease with increasing $F_2$ concentration. FIGS. 3–4 show the dependence of output energy on driving voltage (i.e., of the discharge circuit) for various $F_2$ concentrations of a $F_2$ laser. It is observed from FIGS. 3–4 that for any given driving voltage, the pulse energy decreases with decreasing $F_2$ concentration. In FIG. 3, for example, at 1.9 kV, the pulse energies are around 13 mJ, 11 mJ and 10 mJ for $F_2$ partial pressures of 3.46 mbar, 3.16 mbar and 2.86 mbar, respectively. The legend in FIG. 3 indicates the partial pressures of two premixes, i.e., premix A and premix B, that are filled into the discharge chamber of a KrF laser.

Premix A comprised substantially 1% $F_2$ and 99% Ne, and premix B comprised substantially 1% Kr and 99% Ne. Therefore, for the graph indicated by triangular data points, a partial pressure of 3.46 mbar for premix A indicates that the gas mixture had substantially 3.46 mbar of $F_2$ and a partial pressure of 3200 mbar for premix B indicates that the gas mixture had substantially 32 mbar of Kr, the remainder of the gas mixture being the buffer gas Ne. FIG. 5 shows a steadily increasing bandwidth of a KrF laser with increasing $F_2$ concentration.

In industrial applications, it is advantageous to have an excimer or molecular fluorine laser capable of operating continuously for long periods of time, i.e., having minimal downtime. It is desired to have an excimer or molecular laser capable of running non-stop year round, or at least having a minimal number and duration of down time periods for scheduled maintenance, while maintaining constant output beam parameters.

Uptimes of, e.g., greater than 98% require precise control and stabilization of output beam parameters, which in turn require precise control of the composition of the gas mixture.

Unfortunately, gas contamination occurs during operation of excimer and molecular fluorine lasers due to the aggressive nature of the fluorine or chlorine in the gas mixture. The halogen gas is highly reactive and its concentration in the gas mixture decreases as it reacts, leaving traces of contaminants. The halogen gas reacts with materials of the discharge chamber or tube as well as with other gases in the mixture. Moreover, the reactions take place and the gas mixture degrades whether the laser is operating (discharging) or not. The passive gas lifetime is about one week for a typical KrF-laser.

During operation of a KrF-excimer laser, such contaminants as HF, $CF_4$, $COF_2$, $SiF_4$ have been observed to increase in concentration rapidly (see G. M. Jurisch et al., *Gas Contaminant Effects in Discharge-Excited KrF Lasers,* Applied Optics, Vol. 31, No. 12, pp. 1975–1981 (Apr. 20, 1992)). For a static KrF laser gas mixture, i.e., with no discharge running, increases in the concentrations of HF, $O_2$, $CO_2$ and $SiF_4$ have been observed (see Jurisch et al., above).

One way to effectively reduce this gas degradation is by reducing or eliminating contamination sources within the laser discharge chamber. With this in mind, an all metal, ceramic laser tube has been disclosed (see D. Basting et al., *Laserrohr für halogenhaltige Gasentladungslaser"* G 295 20 280.1, Jan. 25, 1995/Apr. 18, 1996 (disclosing the Lambda Physik Novatube, and hereby incorporated by reference into the present application)). FIG. 6 qualitatively illustrates how using a tube comprising materials that are more resistant to halogen erosion (plot B) can slow the reduction of $F_2$ concentration in the gas mixture compared to using a tube which is not resistant to halogen erosion (plot A). The $F_2$ concentration is shown in plot A to decrease to about 60% of its initial value after about 70 million pulses, whereas the $F_2$ concentration is shown in plot B to decrease only to about 80% of its initial value after the same number of pulses. Gas purification systems, such as cryogenic gas filters (see U.S. Pat. Nos. 4,534,034, 5,136,605, 5,430,752, 5,111,473 and 5,001,721 assigned to the same assignee, and hereby incorporated by reference) or electrostatic particle filters (see U.S. Pat. No. 4,534,034, assigned to the same assignee and U.S. Pat. No. 5,586,134, each of which is incorporated by reference) are also being used to extend KrF laser gas lifetimes to 100 million shots before a new fill is advisable.

It is not easy to directly measure the halogen concentration within the laser tube for making rapid online adjustments (see U.S. Pat. No. 5,149,659 (disclosing monitoring chemical reactions in the gas mixture)). Therefore, it is recognized in the present invention that an advantageous method applicable to industrial laser systems includes using a known relationship between $F_2$ concentration and a laser parameter, such as one of the $F_2$ concentration dependent output beam parameters mentioned above. In such a method, precise values of the parameter would be directly measured, and the $F_2$ concentration would be calculated from those values. In this way, the $F_2$ concentration may be indirectly monitored.

Methods have been disclosed for indirectly monitoring halogen depletion in a narrow band excimer laser by monitoring beam profile (see U.S. Pat. No. 5,642,374, hereby incorporated by reference) and spectral (band) width (see U.S. Pat. No. 5,450,436, hereby incorporated by reference). Neither of these methods is particularly reliable, however, since beam profile and bandwidth are each influenced by various other operation conditions such as repetition rate, tuning accuracy, thermal conditions and aging of the laser tube. That is, the same bandwidth can be generated by different gas compositions depending on these other operating conditions.

An advantageous technique monitors amplified spontaneous emission (ASE), and is described in U.S. patent application Ser. No. 09/418,052 (assigned to the same assignee and hereby incorporated by reference). The ASE is very sensitive to changes in fluorine concentration, and thus the fluorine concentration may be monitored indirectly by monitoring the ASE, notwithstanding whether other parameters are changing and effecting each other as the fluorine concentration in the gas mixture changes.

It is known to compensate the degradation in laser efficiency due to halogen depletion by steadily increasing the driving voltage of the discharge circuit to maintain the output beam at constant energy. To illustrate this, FIG. 7 shows how at constant driving voltage, the energy of output laser pulses decreases with pulse count. FIG. 8 then shows how the driving voltage may be steadily increased to compensate the halogen depletion and thereby produce output pulses of constant energy.

One drawback of this approach is that output beam parameters other than energy such as those discussed above with respect to FIGS. 1–5 affected by the gas mixture degradation will not be correspondingly corrected by steadily increasing the driving voltage. FIGS. 9–11 illustrate this point showing the driving voltage dependencies, respectively, of the long and short axis beam profiles, short axis beam divergence and energy stability sigma. Moreover, at some point the halogen becomes so depleted that the driving voltage reaches its maximum value and the pulse energy cannot be maintained without refreshing the gas mixture.

It is desired to have a method of stabilizing all of the output parameters affected by halogen depletion and not just the energy of output pulses. It is recognized in the present invention that this is most advantageously achieved by adjusting the halogen and rare gas concentrations themselves.

There are techniques available for replenishing a gas mixture by injecting additional rare and halogen gases into the discharge chamber between new gas fills and to methods including readjusting the gas pressure, e.g., by releasing gases from the laser tube (see especially U.S. patent applications Ser. No. 60/124,785, and Ser. No. 09/379,034, and also U.S. Pat. application Ser. No. 09/418,052; and U.S. Pat. Nos. 5,396,514 and 4,977,573, each of which is assigned to the same assignee and hereby incorporated by reference). A more complex system monitors gas mixture degradation and readjusts the gas mixture using selective replenishment algorithms for each gas of the gas mixture (see U.S. Pat. No. 5,440,578, hereby incorporated by reference). One technique uses an expert system including a database of information and graphs corresponding to different gas mixtures and laser operating conditions (see the '034 Application, mentioned just above). A data set of driving voltage versus output pulse energy, e.g., is measured and compared to a stored "master" data set corresponding to an optimal gas composition such as may be present in the discharge chamber after a new fill. From a comparison of values of the data sets and/or the slopes of graphs generated from the data sets, a present gas mixture status and appropriate gas replenishment procedures, if any, may be determined and undertaken to reoptimize the gas mixture. Early gas replenishment procedures are described in the '573 application (mentioned above).

Most conventional techniques generally produce some disturbances in laser operation conditions when the gas is replenished. For example, strong pronounced jumps of the driving voltage are produced as a result of macro-halogen injections (macro-Hl) as illustrated in FIG. 12 (macro-Hl are distinguished from micro-halogen injections, or $\mu$Hl, as described in the '785 application). The result of a macro-Hl is a strong distortion of meaningful output beam parameters such as the pulse-to-pulse stability. For this reason, in some techniques, the laser is typically shut down and restarted for gas replenishment, remarkably reducing laser uptime (see U.S. Pat. No. 5,450,436).

The '785 application referred to above provides a technique wherein gas replenishment is performed for maintaining constant gas mixture conditions without disturbing significant output beam parameters. The '785 application describes a gas discharge laser system which has a discharge chamber containing a gas mixture including a constituent halogen containing species, a pair of electrodes connected to a power supply circuit including a driving voltage for energizing the first gas mixture, and a resonator surrounding the discharge chamber for generating a laser beam.

A gas supply unit is connected to the discharge chamber for replenishing the gas mixture including the constituent halogen-containing species. The gas supply unit includes a gas inlet port having a valve for permitting a small amount of gas to inject into the discharge chamber to mix with the gas mixture therein. A processor monitors a parameter indicative of the partial pressure of the first constituent gas and controls the valve at successive predetermined intervals to compensate a degradation of the constituent halogen-containing species in the gas mixture.

The partial pressure of the halogen containing-species in the gas mixture is increased by an amount preferably less than 0.2 mbar, as a result of each successive injection. The gaseous composition of the injected gas is preferably 1%–5% of the halogen-containing gas and 95%–99% buffer gas, so that the overall pressure in the discharge chamber increases by less than 20 mbar, and preferably less than 10 mbar per gas injection.

The processor monitors the parameter indicative of the partial pressure of the halogen-containing gas and the parameter varies with a known correspondence to the partial pressure of the halogen gas. The small gas injections each produce only small variations in partial pressure of the halogen gas in the gas mixture of the laser tube, and thus discontinuities in laser output beam parameters are reduced or altogether avoided.

The constituent gas is typically a halogen containing molecular species such as molecular fluorine or hydrogen chloride. The constituent gas to be replenished using the method of the '785 application may alternatively be an active rare gas or gas additive. The monitored parameter may be any of time, shot count, driving voltage for maintaining a constant laser beam output energy, pulse shape, pulse duration, pulse stability, beam profile, bandwidth of the laser beam, energy stability, temporal pulse width, temporal coherence, spatial coherence, amplified spontaneous emission (ASE), discharge width, and long and short axial beam profiles and divergences, or a combination thereof. Each of these parameters varies with a known correspondence to the partial pressure of the halogen, and then halogen partial pressure is then precisely controlled using the small gas injections to provide stable output beam parameters.

The gas supply unit of the '785 application preferably includes a small gas reservoir for storing the constituent gas or second gas mixture prior to being injected into the discharge chamber (see U.S. Pat. No. 5,396,514, which is assigned to the same assignee and is hereby incorporated by reference, for a general description of how such a gas reservoir may be used). The reservoir may be the volume of the valve assembly or an additional accumulator. The accumulator is advantageous for controlling the amount of the gas to be injected. The pressure and volume of the gases to be injected are selected so that the overall pressure in the discharge chamber will increase by a predetermined amount preferably less than 10 mbar, and preferably between 0.1 and 2 mbar, with each injection. As above, the halogen partial presssure preferably increases by less than 0.2 mbar and preferably far less such as around 0.02 mbar per injection. These preferred partial pressures may be varied depending on the percentage concentration of the halogen containing species in the gas premixture to be injected.

Injections may be continuously performed during operation of the laser in selected amounts and at selected small intervals. Alternatively, a series of injections may be performed at small intervals followed by periods wherein no injections are performed. The series of injections followed by the latent period would then be repeated at predetermined larger intervals. A comprehensive algorithm is desired for performing gas actions in order to better stabilize the gas composition in the laser tube, and correspondingly better stabilize significant parameters of the output beam of the excimer or molecular fluorine laser system.

SUMMARY OF THE INVENTION

It is an therefore an object of the invention to provide an improved excimer or molecular laser system, wherein the gas mixture status may be precisely and periodically determined and smoothly adjusted.

It is a further object of the invention to provide a technique which automatically compensates gas mixture degradation without disturbing laser operation conditions when the gas is replenished.

It is another object of the invention to provide an improved excimer or molecular laser system capable of running continuously while maintaining stable output beam parameters.

In accord with the above objects, a gas replenishment technique is provided for an excimer or molecular fluorine laser system. The technique encompasses several aspects of the present invention, each contributing to achieving the above objects. In a first aspect, it is recognized that the fluorine concentration in the laser gas mixture has a known correspondence to the value of the driving voltage, when the driving voltage is being adjusted to maintain a constant pulse-to-pulse output beam energy, constant energy dose or moving average energy dose, optimum energy stability, etc. Thus, a particular gas replenishment action is performed first based on the value of the driving voltage for each gas action, and then based on a counter that counts total accumulated electrical input to the discharge, time and/or pulse count.

For example, the amount of gas including a halogen-containing species and/or the total amount of gas injected may be based on the driving voltage. Whether the gas action is a partial or mini gas replacement or only a gas injection is also determined based on the driving voltage. It may be determined that no gas action will be presently performed. Also, the interval between the previous gas action and the next gas action may be adjusted.

Another factor that is preferably taken in account in determining the above particulars of the next gas action is the specific amount of halogen that was injected during the previous gas action. That amount may be determined based on measurements of the gas pressure in an accumulator (see the '785 application) from which the gas was injected during the previous gas action (and optionally also based on the pressure in the laser tube). The temperatures of the gas mixtures in the laser tube and the accumulator may also be taken into account.

On a larger overall scale, or macro scale, the determination of which gas actions are to be performed, if any, may be based on which of several ranges of driving voltages that the driving voltage is presently at. For example, if the driving voltage is presently in a first range, then partial gas replacement (PGR) will be performed for cleaning the gas mixture, and causing the driving voltage to vary out of the first range.

If the driving voltage is presently in a second range below the first range, then enhanced $\mu$Hls together with periodic mini-gas replacements (MGR) are performed, preferably subject to adjustments as described above from injection to injection and/or from MGR to MGR, until the driving voltage varies out of the second range. Enhanced $\mu$Hls may include injections of larger amounts of halogen than ordinary $\mu$Hls, or the injections may be performed more often or at reduced intervals than ordinary $\mu$Hls would be performed.

If the driving voltage is presently in a third range below the second range, then ordinary $\mu$Hls together with periodic mini-gas replacements (MGR) are performed, preferably subject to adjustments as described above from injection to injection and/or from MGR to MGR, until and unless the driving voltage varies out of the third range.

If the driving voltage is presently in a fourth range below the third range, then no gas actions are performed. Alternatively, a gas replacement action may be performed, e.g., to reduce the fluorine concentration in the gas mixture.

More than MGR may be performed, or more than one amount of gas may be injected (and correspondingly released) during MGRs, as well, or the interval between MGRs may be adjusted.

In addition, after a new fill of the laser tube, the system of the present invention is adjusted depending on the age of the tube and/or the optics of the laser resonator. The driving voltage ranges may adjusted within which the particular types of gas actions are performed as described above.

BRIEF DESCRIPTION OF THE DRAWINGS

FIG. 13b shows a schematic diagram of the gas control unit of the excimer or molecular laser of FIG. 13a.

DETAILED DESCRIPTION OF THE PREFERRED EMBODIMENTS

Figure 13A:
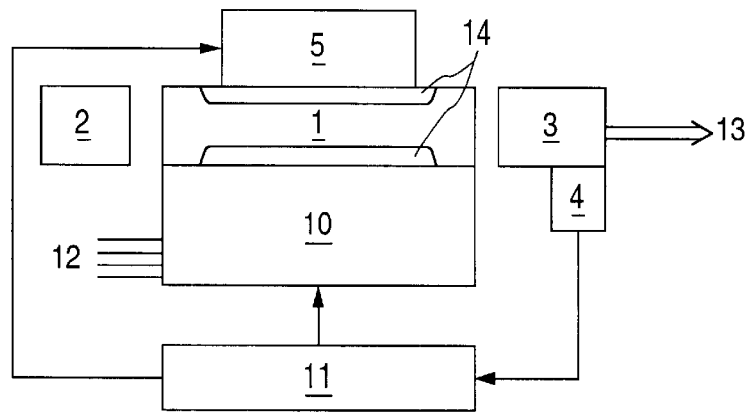
FIG. 13a shows a schematic block diagram of an excimer or molecular laser in accord with a preferred embodiment.

FIG. 13a shows a schematic block diagram of a preferred embodiment of an excimer or molecular fluorine laser. The laser system of FIG. 13a includes a laser tube 1 including an electrode or discharge chamber and a gas flow vessel, wherein the gas flow vessel typically includes a blower and heat exchanger or cooling unit. The laser tube 1 contains a laser gas mixture, and a pressure gauge P is preferably provided for monitoring the pressure in the laser tube 1. A resonator surrounds the tube 1 and includes a rear optics module 2 and a front optics module 3.

The rear optics module 2 includes a resonator reflector which may be a highly reflective mirror, a grating or a highly reflecting surface of another optical component such as an etalon or a prism. A wavelength calibration module is preferably included with the rear optics module. Preferred wavelength calibration units or devices and techniques are disclosed in U.S. Pat. No. 4,905,243 and U.S. patent applications Ser. Nos. 09/136,275, 09/167,657 and 09/179,262, each of which is assigned to the same assignee as the present application and is hereby incorporated by reference.

The front optics module 3 preferably includes a resonator reflector which is preferably an output coupler. The resonator reflector of the front optics module may alternatively be a highly reflecting mirror and other means for output coupling the beam 13 may be used, such as a beam splitter or other angled partially reflecting surface within the resonator. The front optics module 3 also may include a line narrowing and/or selection unit and/or a wavelength tuning unit.

Alternatively, the line narrowing and/or selection unit and/or wavelength tuning unit may be included with the rear optics module. Such optical elements as one or more beam expanding elements such as beam expanding prism(s) and/or lens arrangements, one or more dispersive is elements such as dispersive prism(s) and/or a grating, one or more etalons, birefringent plate(s), or grism(s) may be included for line narrowing, selection and/or tuning. U.S. Pat. Nos. 4,399, 540, 4,905,243, 5,226,050, 5,559,816, 5,659,419, 5,663,973, 5,761,236, and 5,946,337, and U.S. patent application Ser.

Nos. 09/317,695, 09/130,277, 09/244,554, 09/317,527, 09/073,070, Nos. 60/124,241, 60/140,532, and No. 60/140,531, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, and 4,829,536, are each hereby incorporated by reference into the present application, as describing line narrowing, selection and/or tuning elements, devices and/or techniques, among others known to those skilled in the art, which may be used in a laser system according to the preferred embodiment.

Wavelength, pulse energy, and gas control information, as well as other information about the laser system is received by a processor 11. The processor 11 controls the wavelength of the output beam 13 by controlling the line tuning module based on the wavelength information the processor 11 receives, the electrical pulse power and discharge module ("pulse power module") 5 based on pulse energy information it receives, and gas control elements 6–10 and 12 based on information it receives relating to the gas mixture status, and on data saved in its database(s) (see the '653 application, above).

A beam portion is preferably received by an energy monitor 4 which measures the energy and/or angular distribution and/or other beam parameters of the received beam portion of the output beam 13. Data corresponding to the energy of the beam portion is then sent to the processor 11 which is connected to the energy monitor 4. The processor 11 then uses this information to perform processing relating to the energy of the output beam 13.

The pulse power module 5 provides energy to the gas mixture via a pair of electrodes 14 within the discharge chamber 1. Preferably, a preionization unit (not shown) is also energized by the pulse power module for preionizing the gas mixture just prior to the main discharge. The energy of the output beam 13 of the laser system has a known dependence on the "driving voltage" of the pulse power module. The driving voltage is adjusted during laser operation to control and stabilize the energy of the output beam 13. The processor 11 controls the driving voltage based on the energy information received from the energy monitor 4. In accord with the present invention, the processor 11 also controls and stabilizes the status of the gas mixture and thus indirectly controls and stabilizes other laser output beam parameters such as energy stability, temporal pulse width, spatial and temporal coherences, bandwidth, and long and short axial beam profiles and divergences by controlling the status of the gas mixture within the laser tube 1.

Figure 13B:
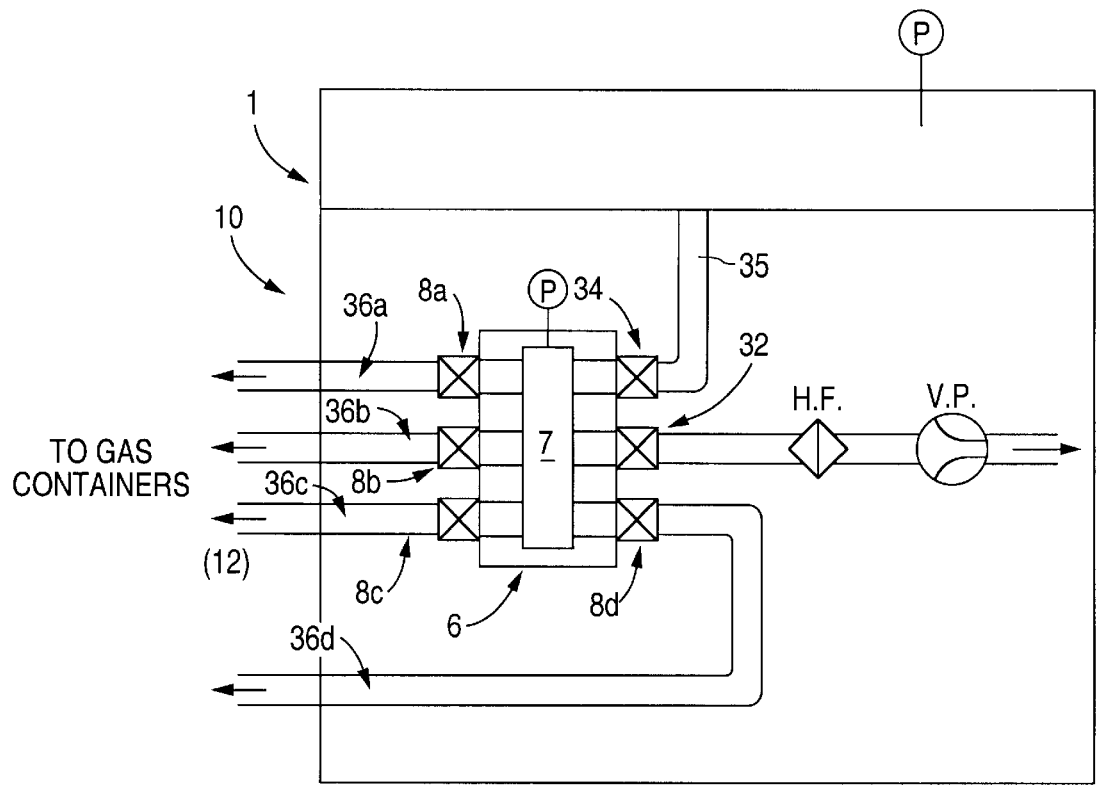

FIG. 13b shows a detailed schematic of the gas control box 10 of FIG. 13a. The gas control box 10 is connected to the laser tube 1 for supplying gas based on control signals received from the processor 11. The processor 11 regulates the delivery of gases or mixtures of gases to the laser tube 1 via a valve assembly 6 or system of valves. The valve assembly preferably has a reservoir or compartment 7 having a known volume and having a pressure gauge P attached for measuring the pressure in the compartment 7. The compartment as well as the laser tube preferably also each have means, such as a thermocouple arrangement, for measuring the temperature of the gases within the compartment and tube. The compartment 7 may be 20 cm$^3$ or so in volumetric size (by contrast, the laser tube 1 may be 42,000 cm$^3$ volumetrically). Four valves 8a–8d are shown as controlling the flow of gases contained in external gas containers into the compartment 7. Of course, more or less than four such valves may be provided. Another valve 32 is shown controlling the access of a vacuum pump vp to the compartment 7 which is shown connected through a halogen filter hf. Another valve 34 is shown controlling the flow of gases between the compartment 7 and the laser tube 1. A further valve or valves (not shown) may be provided along the line 35 from valve 34 to the tube 1 for controlling the atmosphere in the line 35, e.g., using a pump for evacuating the line 35.

Small amounts of a gas or gas mixture are preferably injected from the compartment 7 into the discharge chamber 1 as μHls or enhanced μHls, or during a PGR or MGR action. As an example, the gas supply connected to the valve assembly 6 through gas line 36a may be a premix A including 1%F$_2$:99%Ne, and that through gas line 36b may be a premix B including 1% Kr:99% Ne, for a KrF laser. For an ArF laser, premix B would have Ar instead of Kr, and for a F$_2$ laser premix B is not used. Thus, by injecting premix A and premix B into the tube 1 via the valve assembly, the fluorine and krypton concentrations in the laser tube 1, respectively, may be replenished. Gas lines 36c and 36d may be used for different additional gas mixtures. Although not shown, the tube 1 preferably has additional means for releasing gas, or alternatively, the gas is released through the valve assembly, such as via valves 34 and 32.

New fills, partial and mini gas replacements and gas injection procedures, e.g., enhanced and ordinary micro-halogen injections, and any and all other gas replenishment actions are initiated and controlled by the processor 11 which controls the valve assembly 6 and the pump vp based on various input information in a feedback loop.

An exemplary method according to the present invention is next described for accurately and precisely replenishing the fluorine concentration in the laser tube 1 in small amounts such that significant output beam parameters are not significantly disturbed, if at all, with each gas injection. The processor 11, which is monitoring a parameter indicative of the fluorine concentration in the laser tube 11, determines that it is time for a micro-halogen injection (μHl).

The processor 11 then sends a signal that causes valve 8a to open and allow premix A to fill the compartment 7 to a predetermined pressure, e.g., 5 bar. Then, valve 8a is closed and valve 34 is opened allowing at least some of the premix A that was filled into the compartment 7 to release into the laser tube 1.

If the pressure in the tube was 3 bar prior to the injection and the tube has 42,000 cm$^3$, and the injection is such that the pressure in the accumulator was reduced to 3 bar after the injection, then 2×20/40,000 bar would be the pressure increase in the tube 1 as a result of the injection, or 1 mbar. If the premix A contains 1%F$_2$:99%Ne, then the increase in partial pressure of the F$_2$ in the laser tube as a result of the injection would be approximately 0.01 mbar.

The above calculation may be performed by the processor 11 to determine more precisely how much F$_2$ was injected, or prior to injection, the pressure in the compartment 7 may be set according to a calculation by the processor 11 concerning how much F$_2$ should be injected based on the status information of the monitored parameter received by the processor 11, or based on pre-programmed criteria. A correction for difference in temperature between the gas in the compartment 7 and that in the tube 1 may also be performed by the processor 11 for more accuracy, or the temperature of the gas in the compartment 7 may be preset, e.g., to the temperature within the laser tube 1.

Preferably, an amount of gas premix corresponding to smaller than 10 mbar total gas pressure, or 0.1 mbar F$_2$ partial pressure, increase in the tube 1 is injected from the compartment 7. Even more preferably, less than 5 mbar or even 2 mbar total gas pressure (0.05 or 0.02 mbar $F_2$ partial pressure) increase in the laser tube 1 results from the gas injection.

The compartment 7 may simply be the valve assembly 6 itself, or may be an additional accumulator (described in detail below). The compartment 7 is also configured so that the small amounts of gas may be injected at successive very short intervals, to compensate a degradation of a halogen gas and/or another gas or gases within the discharge chamber 1 of an excimer or molecular laser such as a KrF, ArF or $F_2$ laser.

There may be more than one compartment like compartment 7, as described above, each having different properties such as volumetric space. For example, there may be two compartments, one for $\mu$Hls and the other for enhanced $\mu$Hls. There may be more than two, for still further versatility in the amounts of halogen to be injected in a gas action, and for adjusting the driving voltage ranges corresponding to different gas action algorithms. Different premixes may be injected from the different compartments. Also, the exemplary method described using premixes of particular gas compositions, but many different gas compositions could be used in accord with the present invention. For example, gas compositions having higher fluorine (or hydrogen chloride) percentage concentrations could be used such as 5% or 2% instead of 1%. There also may be an additional valve connected to a 100% buffer gas container.

Advantageously, the processor 11 and gas supply unit are configured to permit the delivery or injection of very small amounts of one or more gases or gas mixtures to the discharge chamber 1. The injection of the small amounts of the gas or gas mixture result in gas pressure increases in the discharge chamber 1 below 10 mbar, and preferably between 0.1 and 2 mbar. Each gas in the gas mixture within the discharge chamber 1 may be separately regulated so the gas composition within the discharge chamber may be precisely controlled. For example, similar injections of Kr, Ar or Xe may be performed for replenishing those gases in the laser tube 1.

Because the amount of gas injected during a gas injection or replacement procedure is small, laser output beam parameters do not vary greatly with each injection. The injections are preferably carried out periodically at predetermined intervals corresponding to known depletion amounts of the gases. For example, if the halogen partial pressure in the gas mixture of an $F_2$ laser is known, under current operating conditions, to be around 3 bar after a new fill and to deplete by 0.1 mbar per X minutes or Y shots, then halogen injections including, e.g., 1 mbar (pressure increase in tube 1) of a premix including 1% $F_2$ could be performed every X/10 minutes or Y/10 shots, in accord with the present invention, to maintain the concentration of the halogen, or halogen injections of 2 mbar of the premix may be performed every X/5 minutes, and so on. Also, micro-halogen injections ($\mu$Hl) of 1 mbar of premix A including 1% $F_2$ and 99% Ne buffer may be injected every X/5 minutes for 100 minutes followed by a period of 100 minutes when no injections are performed. Many variations are possible within the spirit of the present invention including irregular gas actions as determined by the processor.

In contrast with the present invention, if, e.g., a 50 mbar (pressure increase in tube 1) premix A injection (again having 1% $F_2$ such that the $F_2$ partial pressure increase in the tube 1 is 0.5 mbar and corresponds to around a 17% increase in the $F_2$ concentration in the tube 1) is performed every 5X minutes or 5Y shots, or at any time, the large injection amount will cause output beam parameters of the laser beam to noticeably and undesirably fluctuate in response. For example, the pulse energy or driving voltage can fluctuate by 10% or more when the large injection is performed. If the laser is not shut down, or industrial processing interrupted, when the large injection is performed, then imprecise industrial processing will occur due to disturbances in meaningful output beam parameters.

The halogen injection algorithm of the present invention may be considered to extend a total halogen injection over a longer period of time or number of pulse counts. Over the period of the several halogen injections, the high voltage and the $F_2$ concentration do not change significantly so that significant changes in pulse energy and pulse energy stability, among other meaningful output beam parameters, are eliminated. Again, some of these other output beam parameters are listed above and each will be extremely stable using the method of the present invention.

Figure 14A:
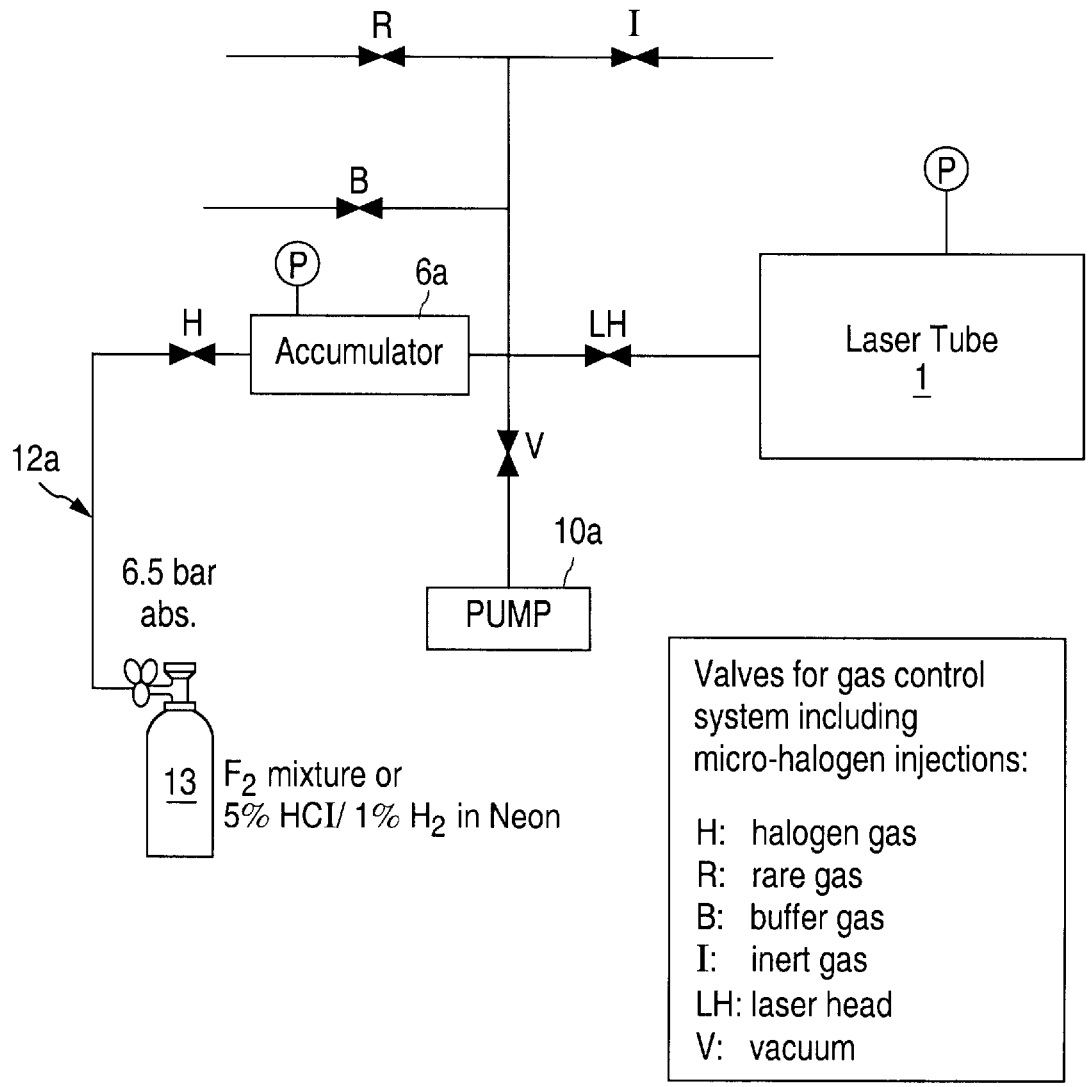
FIG. 14a schematically shows gas lines for halogen injections into the discharge chamber of the laser of FIG. 13 using an accumulator.

FIG. 14a schematically shows another configuration of gas lines for halogen injections into the discharge chamber 1 of the laser of FIG. 13a using an accumulator 6a. The accumulator 6a is connected to the laser tube 1 via laser head valve LH. The accumulator 6a is also connected to a gas line 12a via halogen valve H connected to a gas bottle 13 including the halogen or halogen premix. For example, the gas bottle 13 may be filled with a gas mixture including an $F_2$ mixture (e.g., 5% $F_2$/95% Ne or a 5% HCl/1% $H_2$ in neon mixture or a 1% $F_2$:99% Ne premix, among other possibilities). A pump is shown connected to each of the accumulator 6a and the laser tube 1 via a vacuum valve V. The tube 1 is shown valve-connected to additional gas lines and valves including a buffer gas via valve B, a rare gas or rare gas premix via valve R (used with KrF, ArF, XeCl and XeF excimer lasers, e.g.) and an inert gas via valve l. The inert gas valve l or another valve not depicted may be used for valve connecting to a source of Xe to be used as an additive in the gas mixture within the tube. Again, one or more additional accumulators may be added to the system.

The accumulator 6a has the particular advantage that the small amounts of gas including the $F_2$ within the $F_2$ premix to be injected with each halogen injection in accord with the present invention may be precisely controlled. The accumulator is easily pumped to low pressure. A precise amount of $F_2$ gas or $F_2$ gas premix is released into the accumulator 6a and the amount of $F_2$ is determined according to the total gas pressure within the accumulator, the known volumes of the accumulator 6a and the laser tube 1 and the known concentration of the $F_2$ or the $F_2$ percentage concentration in the premix gas. A $F_2$ partial pressure increase in the laser tube 1 after the injection is determined based on the amount of $F_2$ known to be in the accumulator 6a prior to (and possible after) the injection.

Based on this determination and/or other factors such as the interval between the previous and current gas actions (measured in time or pulse count, e.g.) and/or the value of the driving voltage at the time of the previous, present and/or next gas action, the interval between the current and next gas action and/or the amount of halogen containing gas or total gas to be injected in the next gas action may be determined so that a precise amount of each gas, particularly the halogen-containing gas, may be injected in the next gas action. Also, the type of gas action to be performed may be determined based on these or other factors.

Figure 14B:
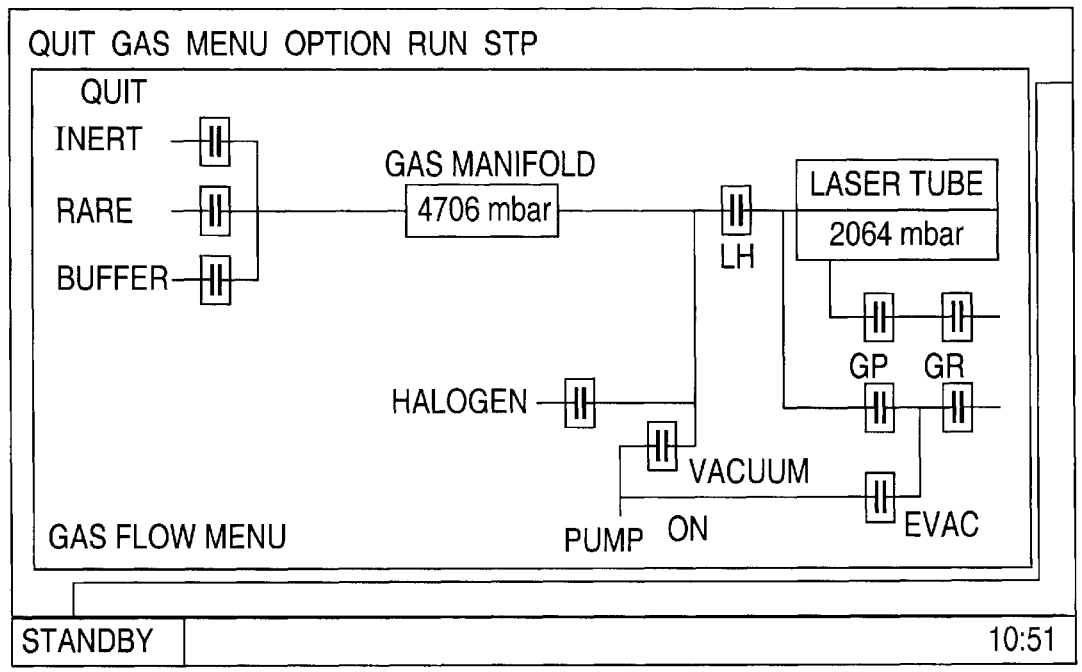
FIG. 14b shows a computer display connected to the processor of FIG. 13a indicating that the processor is controlling the gas replenishment process.

FIG. 14b shows how a display monitor attached to the processor 11 might look as the laser system is operating. The laser tube is shown to have an internal pressure of 2064 mbar, while the pressure within the gas manifold (corresponding to the compartment 7 of FIG. 13*a* or the accumulator 6*a* of FIG. 14*a*) shows an internal pressure of 4706 mbar. As discussed, the precise amount of gas injected into the laser tube can be calculated based in part on these pressure readings. Again, the temperature may be taken into account for making an even more precise determination.

Various gas actions and procedures will now be described. The procedures are potentially applicable to all gas discharge lasers, although excimer lasers (e.g., KrF, ArF, XeCl and XeF) and the $F_2$ laser would benefit greatly by the present invention. The KrF-laser is used as a particular example below.

The process begins with a new fill which is performed prior to operating the laser system. For a new fill, the laser tube 1 is evacuated and a fresh gas mixture is then filled in. A new fill of a KrF-laser would typically result in a gas mixture having approximately the following partition of gases: $F_2$: Kr: Ne=0.1%: 1.0%: 98.9%. If the gas mixture within the KrF laser discharge chamber has a typical total pressure of around p=3000 mbar, then the partial pressures of $F_2$ and Kr would typically be around 3 mbar and 30 mbar, respectively. A new fill for a $F_2$ laser would produce the following typical partition of gases: $F_2$: Ne=0.1%: 99.9%. For the $F_2$ laser, He or a mixture of He and Ne may be used as the buffer instead of only Ne (see the '526 application, above).

The new fill procedure can be performed using separate gas lines delivering pure or premixed gases. Typical gas premixes used regularly in semiconductor industry fabs are premixes A and B, where: premix A has 1% $F_2$/1% Kr/Ne and premix B has 1% Kr/Ne.

After the new fill is performed, the halogen gas begins to react with components of the laser tube 1 that it comes into contact with, whether the laser is operating or not. "Gas replenishment" is a general term which includes gas replacement (PGRs and MGRs each subject to varying amounts and compositions of injected and released gases) and gas injections ($\mu$Hls and enhanced $\mu$Hls again each subject to varying amounts and compositions of injected gases), performed to bring the gas mixture status back closer to new fill status.

Any gas replenishment procedures are performed taking into account that each gas in the gas mixture depletes at a different depletion rate due to the halogen depletion just described and the gas replenishment procedures performed in response. For the narrow band KrF-laser, e.g., $F_2$-depletion occurs at a rate of between about 0.1% to 0.3% (and sometimes up to nearly 1%) per million shots, whereas Kr depletion occurs about 10 to 50 times more slowly. The Ne buffer is less important, but may also be considered as part of an overall gas replenishment operation, e.g., to maintain a desired pressure in the tube 1.

Separate gas actions are preferably performed to replenish each constituent gas of the gas mixture. For the KrF-laser, for example, the $F_2$ may be replenished by halogen or halogen/rare gas or premix A injections and the Kr replenished by rare gas or premix B injections. Other gas additives such as Xe may be replenished by Xe gas or still further premixes C, D, etc. The individual depletion rates also depend on operating conditions of the laser such as whether the laser is in broadband or narrow band mode, the operating energy level, whether the laser is turned off or is in continuous, standby or other burst pattern operation, and the operating repetition rate. The processor 11 is programmed to consider all of these variations in laser operation.

The gas mixture status is considered sufficiently stable in the present invention when deviations in fluorine and krypton content are below 5%, and preferably below 3%. Without any gas replenishment actions, after 100 million shots the partial pressures of $F_2$ and Kr might degrade by between 30% and 100% and between 0.5% and 5%, respectively.

To compensate for the various depletion rates of the gases in the discharge chamber, the present invention performs a variety of separate and cross-linked gas replenishment procedures, which take into account the variety of individual degradation rates by referring to a comprehensive database of different laser operating conditions. A preferred technique is disclosed in the '653 application already mentioned above. The behavior of the particular laser in operation and related experiences with gas degradation under different operating conditions are stored in that database and are used by a processor-controlled "expert system" to determine the current conditions in the laser and manage the gas replenishment or refurbishment operations. A history of gas actions performed during the current operation of the laser may also be used in accord with the present invention.

As mentioned above, series of small gas injections (referred to as enhanced and ordinary micro gas or halogen injections, or $\mu$Hl) can be used to return any constituent gas of an excimer or molecular laser, particularly the very active halogen, to its optimal concentration in the discharge chamber without disturbing significant output beam parameters. However, the gas mixture also degrades over time as contaminants build up in the discharge chamber. Therefore, mini gas replacements (MGR) and partial gas replacements (PGR) are also performed in the preferred methods. Gas replacement generally involves releasing some gas from the discharge chamber, including expelling some of the contaminants. MGR involves replacement of a small amount of gas periodically at longer intervals than the small $\mu$Hls are performed. PGR involves still larger gas replacement and is performed at still longer periodic intervals generally for "cleaning" the gas mixture. The precise intervals in each case depend on consulting current laser operating conditions and the expert system and comprehensive database. The intervals are changes of parameters which vary with a known relationship to the degradation of the gas mixture. As such, the intervals may be one or a combination of time, pulse count or variations in driving voltage, pulse shape, pulse duration, pulse stability, beam profile, coherence, discharge width or bandwidth. In addition, the accumulated pulse energy dose may used as such an interval. Each of $\mu$Hl, MGR and PGR may be performed while the laser system is up and running, thus not compromising laser uptime.

Three exemplary gas replenishment methods for stabilizing an optimum gas mixture are described below. Many other methods are possible including combinations of the ones described below. The methods and parameters used may also be varied during the laser operation depending on the laser operating conditions and based on the data base and the expert system. The processor and gas supply unit are configured to perform many methods based on a comprehensive database of laser operating conditions and gas mixtures statuses.

Each method involves well-defined very small gas actions with small, successive gas injections preferably by injecting a premix of less than 10 mbar and more preferably between 0.1 and 2 mbar including a concentration including preferably 5% or less of the halogen containing species in order not to disturb the laser operation and output beam parameters. Whatever the composition of the premix, it is the amount of the halogen in the premix that is most significant.

That is, the preferred amount of the halogen containing species that is injected in the small gas actions preferably corresponds to less than 0.1 or 0.2 mbar and more preferably between 0.001 and 0.02 mbar partial pressure increase in the laser tube 1.

The first exemplary gas stabilization method involves performing gas injections based on operation time. The method takes into account whether or not the laser is operating, i.e., whether the laser system is up and performing industrial processing, in standby mode, or simply shut off. The first method is thus useful for maintaining either an active or a passive gas composition status. Time-correlated $\mu$Hl, MGR and PGR are performed according to a selectable time interval based on operating conditions. For example, $\mu$Hls may be performed after time intervals $t_1$, MGRs after time intervals $t_2$, and PGRs after time intervals $t_3$.

In accord with the present invention, the time intervals $t_1$, $t_2$ and $t_3$ are adjusted in real time as are the amounts and/or compositions of gases injected during the gas actions. Preferably, the time intervals and gas amounts and compositions are adjusted from gas action to gas action. In addition, the driving voltage ranges within which particular gas actions are performed are preferably also adjusted, at least at each new fill based on the aging of the tube and optical components of the laser resonator. Such ranges may be adjusted during operation, even between new fills, e.g., based on beam-induced effects on the optical components of the line narrowing module (see for a general explanation of such effects U.S. patent application No. 60/124,804, assigned to the same assignee and hereby incorporated by reference).

Below, detailed graphs are described for an operating laser system in accord with the present invention. Typically, gas actions occur after several hours if the laser is in the standby-mode without pulsing or pulsing with low repetition rate (<100Hz). If the laser is completely switched off (power-off-mode), a battery driven internal clock is still running and the expert system can release an adequate, time controlled number of injections during the warm-up phase after re-starting the laser. The number and amount of the injections can be also related to certain driving voltage start conditions which initiate a preferred sequence of gas actions to reestablish optimum gas quality.

Figure 15:
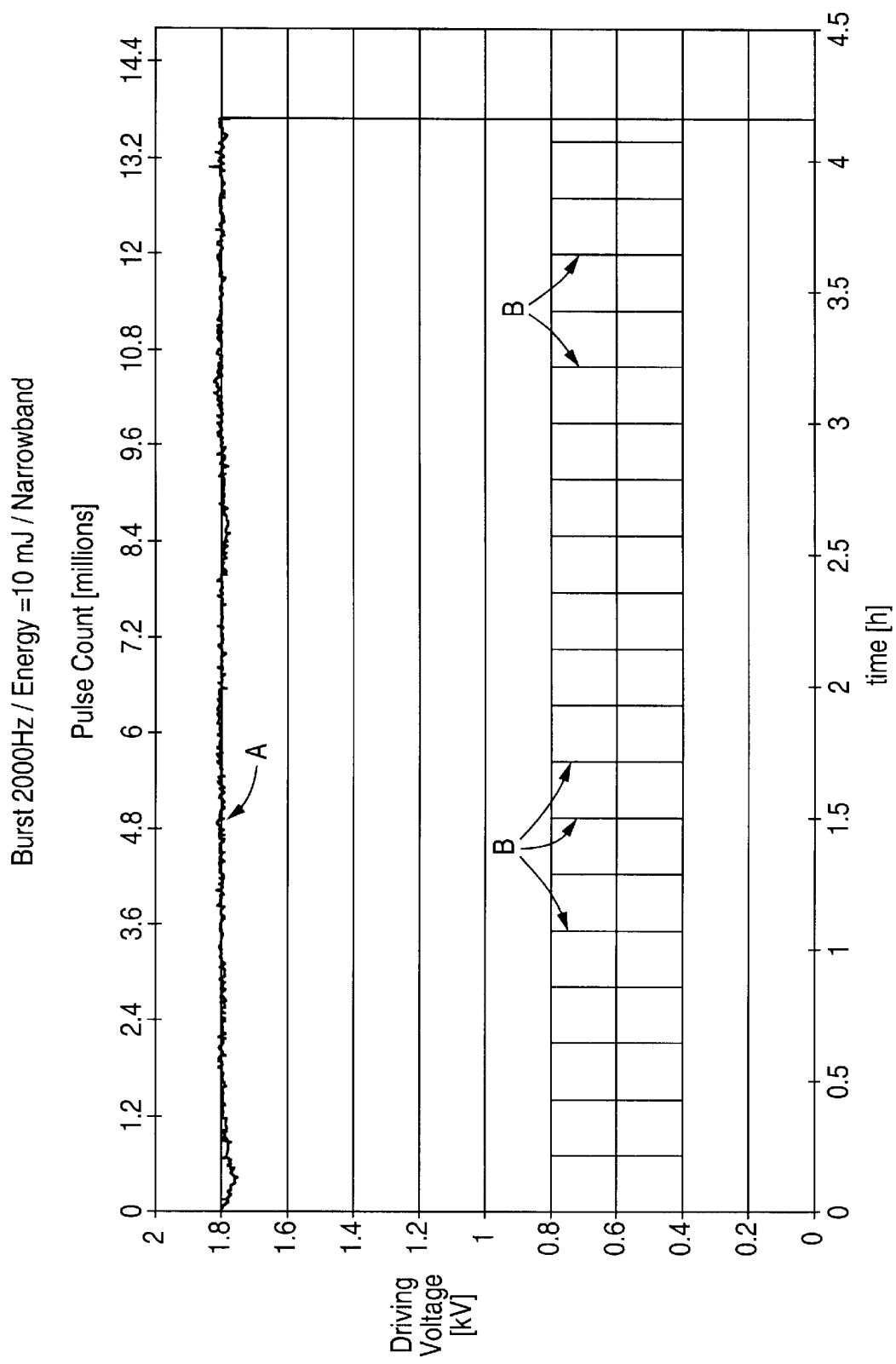
FIG. 15 is a graph of driving voltage versus time also showing periodic halogen injections for a system in accord with a preferred embodiment.
Figure 16:
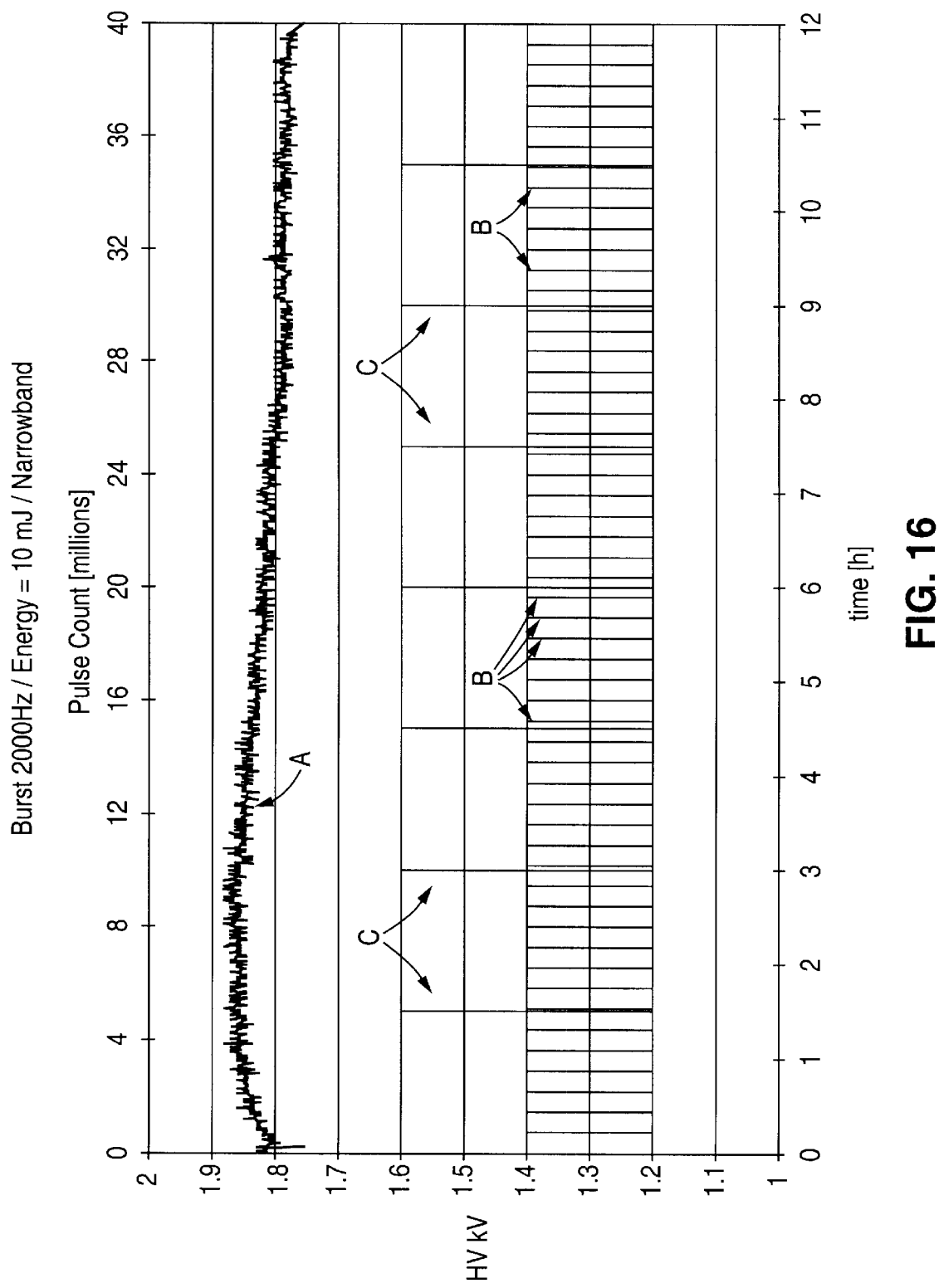
FIG. 16 is a graph of driving voltage versus time also showing periodic halogen injections and mini gas replacements for a system in accord with a preferred embodiment.

FIGS. 15 and 16 are graphs of driving voltage versus time also illustrating the intervals of periodic $\mu$Hl and periodic $\mu$Hl and MGR, respectively, for a fully operating system in accord with the present invention. FIG. 15 includes a plot of driving voltage versus time (A) wherein $\mu$Hls are performed about every 12 minutes, as indicated by the vertical lines (some of which are designated for reference with a "B") on the graph, for a narrowband laser running in 2000 Hz burst mode at 10 mJ output beam energy. The vertical axis only corresponds to graph A. As is shown by graph A, the small $\mu$Hls produce no noticeable discontinuities in the driving voltage.

FIG. 16 is a plot (labelled "A") of driving voltage versus time wherein $\mu$Hls are performed about every 12 minutes, as indicated by the short vertical lines on the graph (again, some of which are designated for reference with a "B" and the vertical axis doesn't describe the halogen injections in any way), and MGR is performed about every 90 minutes, as indicated by the taller vertical lines on the graph (some of which are designated with a "C" for reference and again the vertical axis is insignificant in regard to the MGRs shown), for a narrowband laser running in 2000 Hz burst mode at 10 mJ output beam energy. Again, the driving voltage is substantially constant around 1.8 KV and no major changes, e.g., more than %5, are observed.

Figure 1:
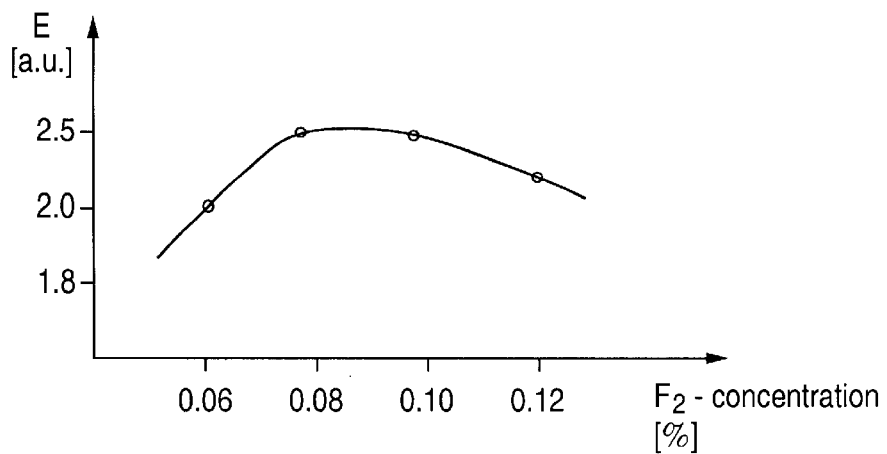
FIG. 1 is a graph of the output efficiency of an excimer or molecular laser versus $F_2$-concentration.
Figure 2:
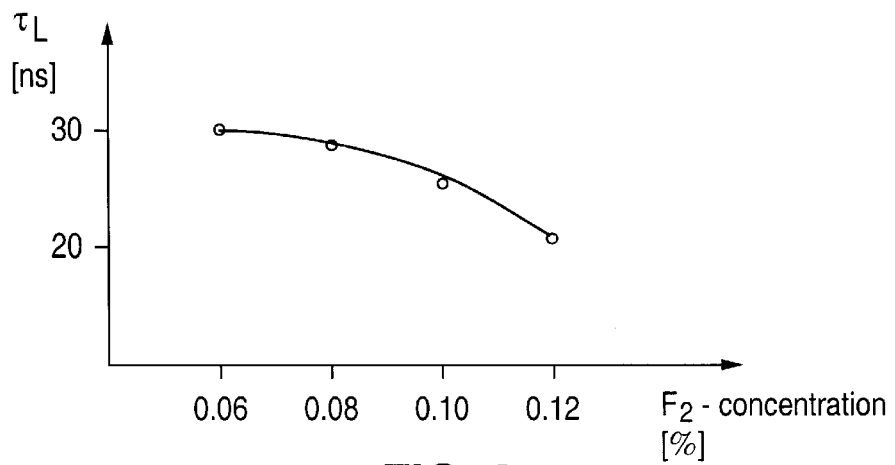
FIG. 2 is a graph of integrated pulse width of an excimer or molecular laser versus $F_2$-concentration
Figure 4:
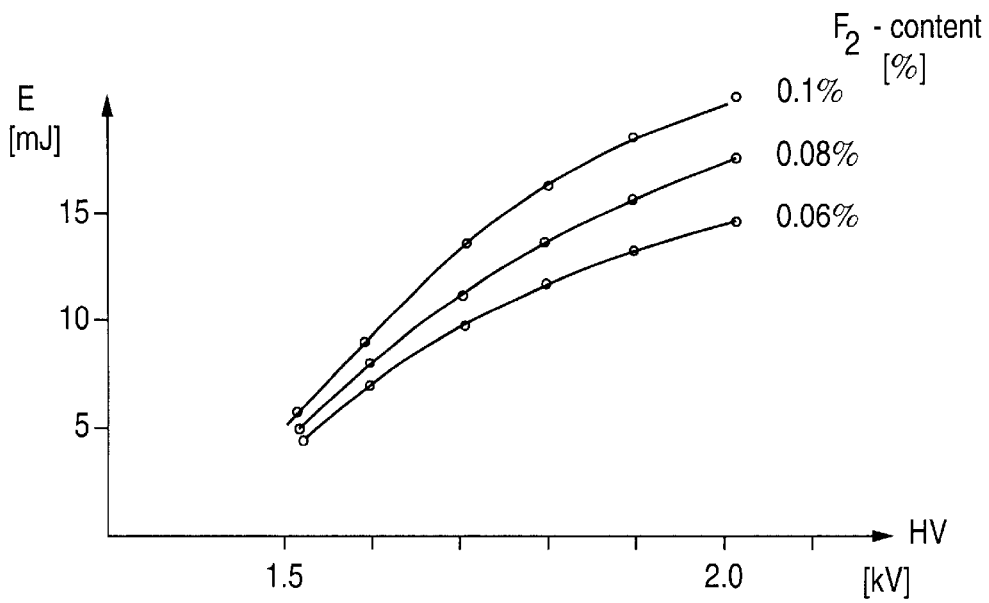
FIG. 4 shows several graphs of output beam energy of an excimer or molecular fluorine laser versus driving voltage for various $F_2$-concentrations.
Figure 3:
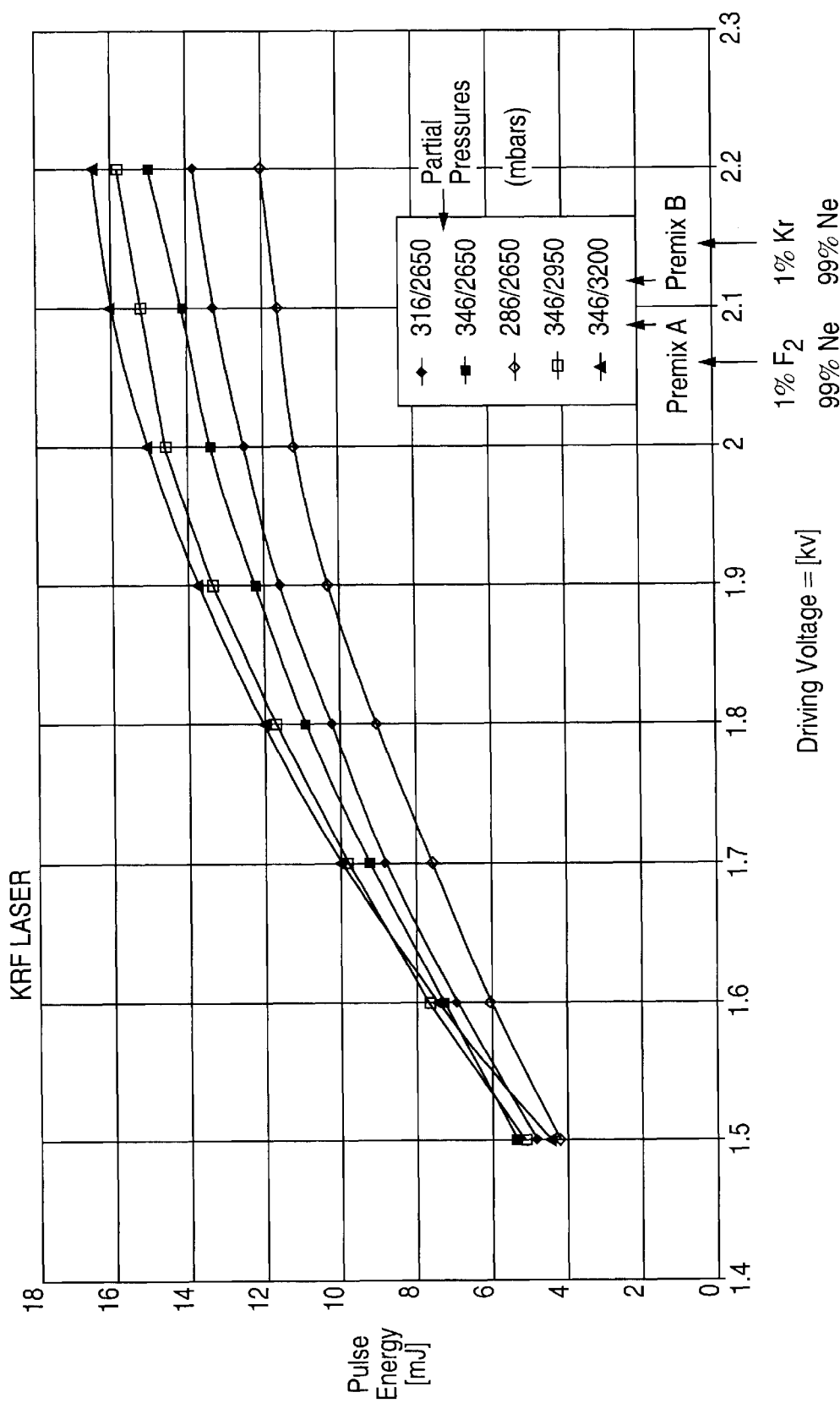
FIG. 3 shows several graphs of output beam energy of a KrF excimer laser versus driving voltage for various gas mixture component partial pressures.
Figure 5:
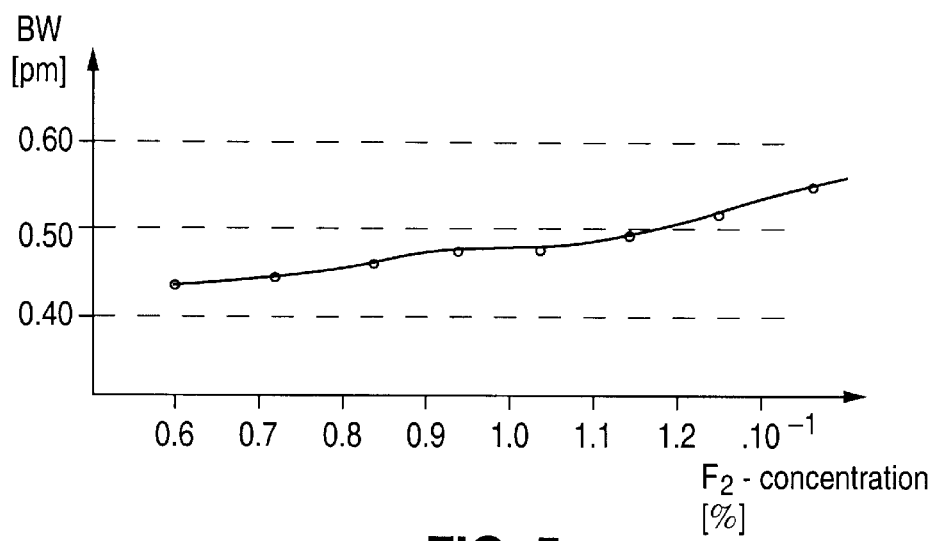
FIG. 5 is a graph of the bandwidth of an excimer laser versus $F_2$-concentration.
Figure 6:
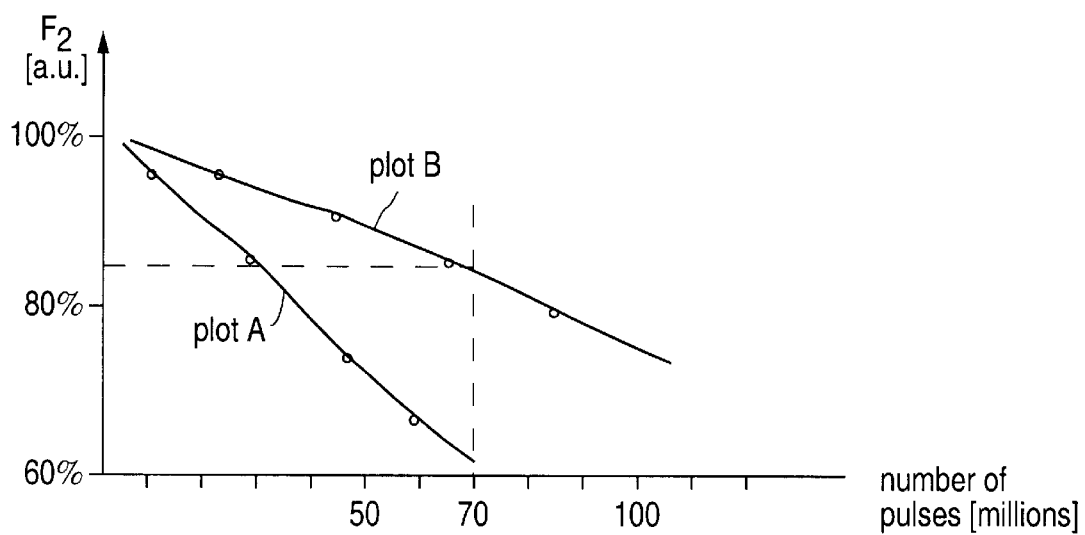
FIG. 6 illustrates how $F_2$ depletion rates vary for excimer or molecular fluorine lasers depending on discharge chamber composition.
Figure 7:
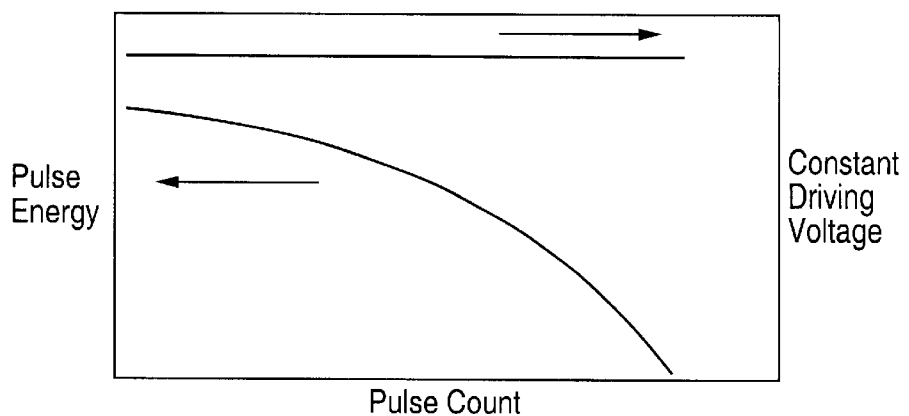
FIG. 7 is a graph of pulse energy versus pulse count for an excimer or molecular laser operating at constant driving voltage.
Figure 8:
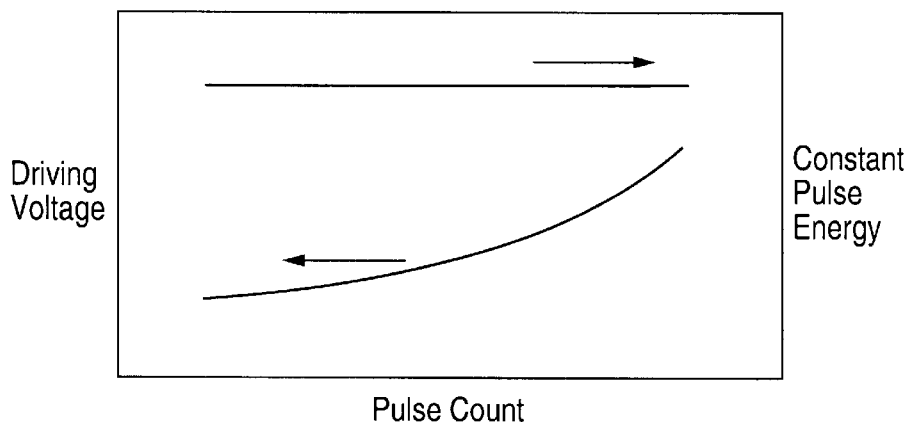
FIG. 8 is a graph of driving voltage versus pulse count for an excimer or molecular laser operating at constant output pulse energy.

A comparison of FIGS. 15 and 16 with FIG. 8 reveals that the present invention advantageously avoids the conventional approach which drastically increases the driving voltage as the gas mixture degrades. By avoiding discontinuities, fluctuations or changes in the driving voltage in this way, disturbances of meaningful output beam parameters are also avoided.

Figure 17:
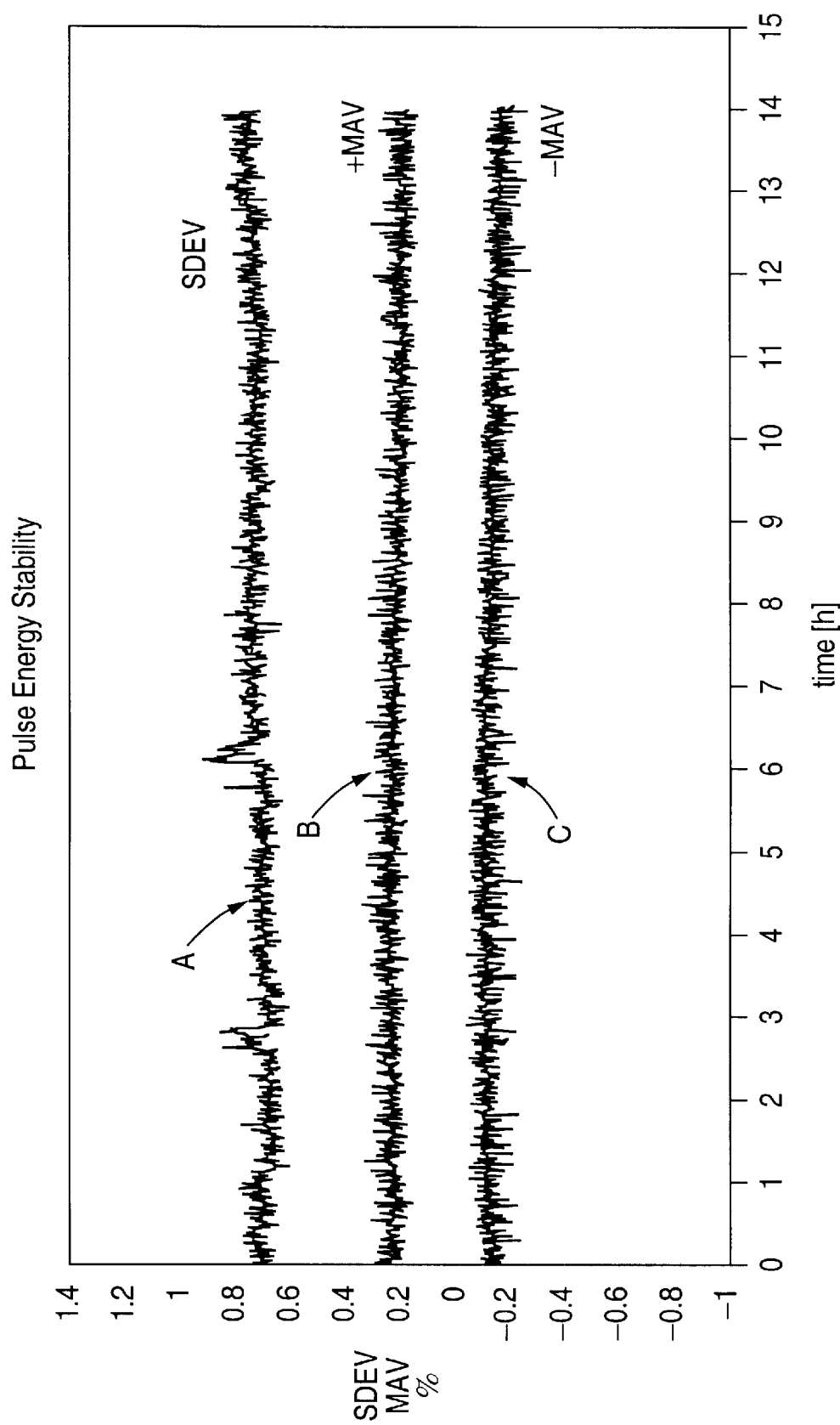
FIG. 17 is a graph of pulse energy stability (sigma, upper graph) versus time and moving averages (over 40 pulse intervals, maximum and minimum) for a laser system operating at 2 kHz in accord with a preferred embodiment.

FIG. 17 includes a graph (labelled "A") of pulse energy stability versus time of the laser pulses by values of standard deviation (SDEV) and moving average stabilities (±MAV) as percentages of the absolute pulse energy for a system in accord with the present invention. The graphs labelled "B" and "C" show the moving average for groups of 40 pulses each.

During this run, micro-halogen injections were performed resulting in very stable continuous laser operation without any detectable deviations caused by the gas replenishment actions.

The second exemplary gas stabilization method involves performing gas injections based on shot or pulse count using a shot or pulse counter.

After certain numbers of laser pulses, e.g., N($\mu$Hl), N(MGR), and N(PGR), depending again on the mode of operation of the laser, $\mu$Hl, MGR and PGR can be respectively performed. Typically, the $\mu$Hls amount to about 0.5 . . . 2.0 mbar of fluorine premix (e.g., 1–5% $F_2$:95–99% Ne) for the KrF, ArF, XeF or $F_2$ lasers (Ne being replaceable with He or a mix of He and Ne) or HCl premix (e.g., 1–5% HCl:1% in Ne or He) for XeCl or KrCl laser and are released after several hundred thousand or even after millions of laser shots. Each $\mu$Hl just compensates the halogen depletion since the last gas action and typically corresponds to less than 0.1 mbar of the halogen containing species and more preferably between 0.001 and 0.02 mbar partial pressure increase in the laser tube 1 per, e.g., 1 million shots. The actual amounts and shot intervals vary depending on the type of laser, the composition of the discharge chamber, the original gas mixture composition and operating mode, e.g., energy, or repetition rate, being used.

A third exemplary method is similar to those described above using time or pulse count, and this method instead uses accumulated energy applied to the discharge. Use of this parameter, and advantages thereof, are set forth in the '525 application. The total input electrical energy to the discharge is maintained in a counter for that purpose, and gas actions are performed after certain intervals or amounts of this input electrical energy are applied.

Also, in accord with a preferred embodiment, the intervals of any of the exemplary methods are dynamically adjusted from injection to injection, as are the amounts of halogen injected with each gas action. The interval between the current and next injection is set based on any one or a combination of parameters such as the driving voltage or any of the output beam parameters described above. In addition, the amount of halogen injected in the current injection and/or the interval between the previous and current injection may be taken into account.

The amount of halogen injected in any $\mu$Hl or enhanced $\mu$Hl may be determined in accord with the present invention by measuring the pressure in the accumulator (see FIGS. 13b and 14a) and the laser tube at the time of the injection, and/or just before, and/or just after the injection. The temperatures of the gases in the accumulator and tube may be measured as well. The interior volumes of the tube and accumulator are known in advance. The well-known formula $PV=Nk_BT$ is used to calculate the amount of halogen injected into the tube during any injection.

For example, if the accumulator has a measured halogen partial pressure $P_a$, and temperature $T_a$, and a volume $V_a$, then the accumulator contains $N_a$ fluorine molecules. If all of the $N_a$ molecules are injected into the laser tube during the injection, and the tube has a temperature $T_T$ and volume $V_T$, then the change in fluorine partial pressure in the tube as a result of the injection will be $\Delta P(F_2)_{T=Pa}V_aT_T/V_TT_a$. Since it is desired to maintain the total number of fluorine molecules in the tube, then it may be more appropriate to calculate the change in the number of fluorine molecules in the tube, i.e., $\Delta N(F_2)_{T=)P(F2)_T}V_T/k_BT_T$, and keep track of that quantity. Then, the amount of halogen and/or the interval before the next injection is determined based on the calculated amount of halogen that was injected in the previous injection, the partial pressure of the halogen in the tube after the previous injection and/or the amount of halogen that it is desired to have in the tube after the next injection.

The overall calculation depends also on the amount of depletion that the halogen gas has undergone (or will undergo) between injections. Such depletion is, in principal, known as a function of many factors, e.g., including time and pulse count (and possibly any of the parameters enumerated above or others). For example, a change in halogen partial pressure (or, alternatively, the number of halogen molecules) in the laser tube in the interval between injections can be calculated to depend on $k_t \times \Delta t$ and on $k_p \times \Delta p$, wherein $k_t$ and $k_p$ are constants that depend on the rate of halogen depletion with time and pulse count, respectively, and $\Delta t$ and $\Delta p$ are the amount of time and the number of pulses, respectively, in the interval under consideration. The number of pulses $\Delta p$ itself depends on the repetition rate, taking into account also the number of pulses in a burst and the pause intervals between bursts for a laser operating in burst mode. Again, other parameters may have an effect and may be additive terms included with this calculation.

Now, from one interval to the next, a calculation could be performed as follows. The increase (or decrease reflected as a negative sum) in fluorine partial pressure in the laser tube over the interval is calculated to be: $\Delta P(F_2)_{interval} \approx P(F_2)_{T\ injection} - k_t \times \Delta t - k_p \times \Delta p$. Again, since it is the total number of fluorine molecules that it is desired to keep constant, then a calculation of the change in the number of molecules is calculated as: $\Delta N(F_2)_{interval} \approx N(F_2)_{T\ injection} - k_t \times \Delta t - k_p \times \Delta p$, where the constants $k_t$ and $k_p$ would differ from the partial pressure calculation by a units conversion.

The overall algorithm would seek to maintain the total number of halogen molecules (or halogen partial pressure) constant. Thus, the changes in particle number (or partial pressure) would be summed continuously over many intervals, or preferably all intervals since the last new fill. That overall sum would be maintained as close as possible to zero, in accord with the present invention.

As discussed, the shot counter can also be used in combination with time related gas replenishment, and either of the shot counter or time related gas replenishment can be used in combination with the total energy applied to the discharge. The shot counter or total applied energy can be used for different laser pulse operation modes, e.g., burst patterns, or continuous pulsing modes at different pulse repetitions wherein a number of individual shot or input energy counters $N_i(Hl)$ are used. All of these different counters can be stored in the data base of the expert system.

Which of the different counters $N_i(Hl)$ is to be used at any time is determined by the software of the expert system.

Figure 18:
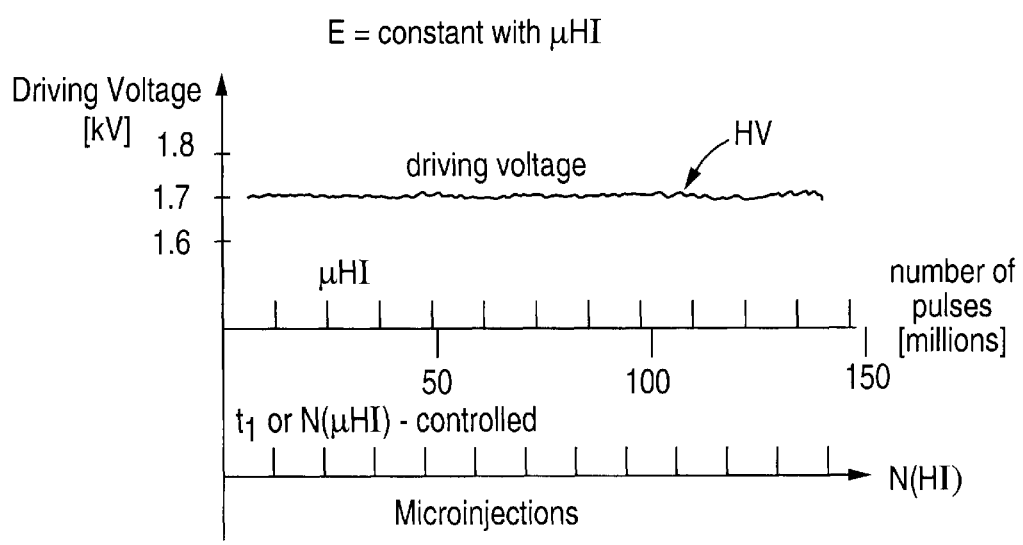
FIG. 18 is qualitative graph of driving voltage versus time also showing periodic micro-halogen injections (:HI) for a system in accord with a preferred embodiment.

FIG. 18 illustrates qualitatively a driving voltage free of discontinuities when small partial pressure increases are effected in the laser discharge chamber due to μHls in accord with the present invention. The driving voltage is shown as being substantially constant at around 1.7 KV over 150 million pulses, while μHls are performed about once every 12 million pulses. The pulse energy is also maintained at a constant level.

Figure 9:
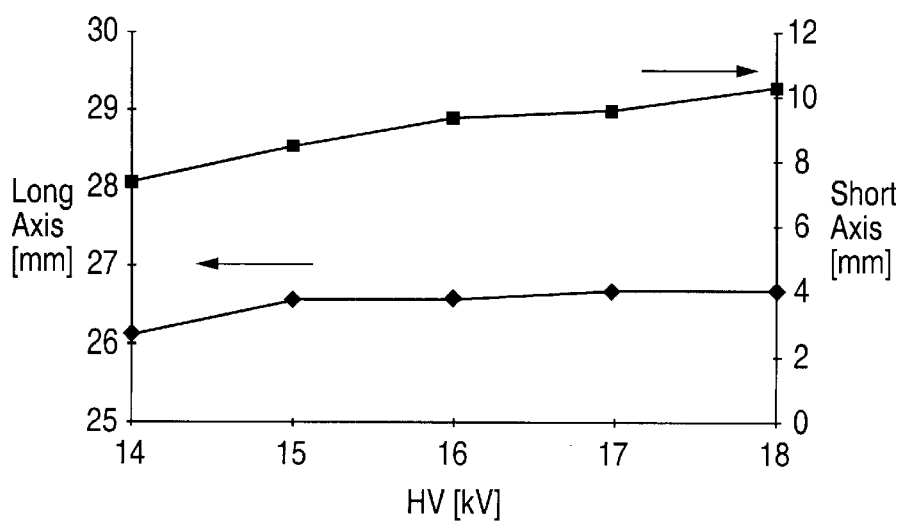
FIG. 9 shows a first graph of the long axis beam profile versus driving voltage and a second graph of the short axis beam profile versus driving voltage for an excimer or molecular laser operating at constant output pulse energy.
Figure 10:
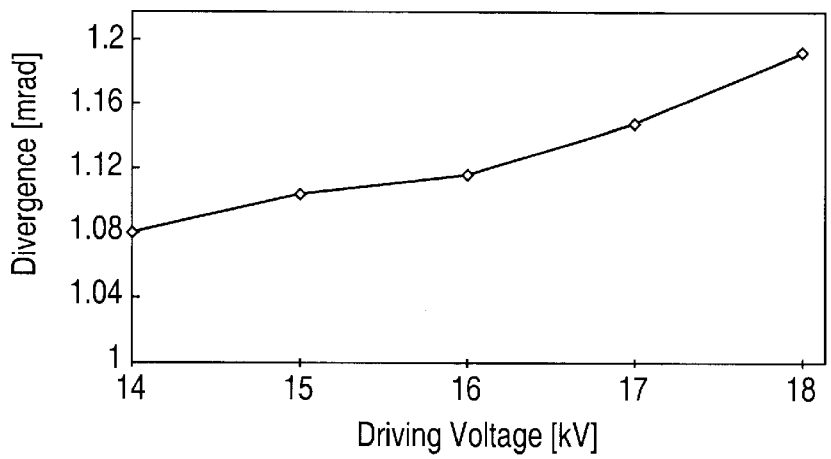
FIG. 10 is a graph of the divergence of the short axis of an output beam versus driving voltage of an excimer or molecular laser operating at constant output pulse energy.
Figure 11:
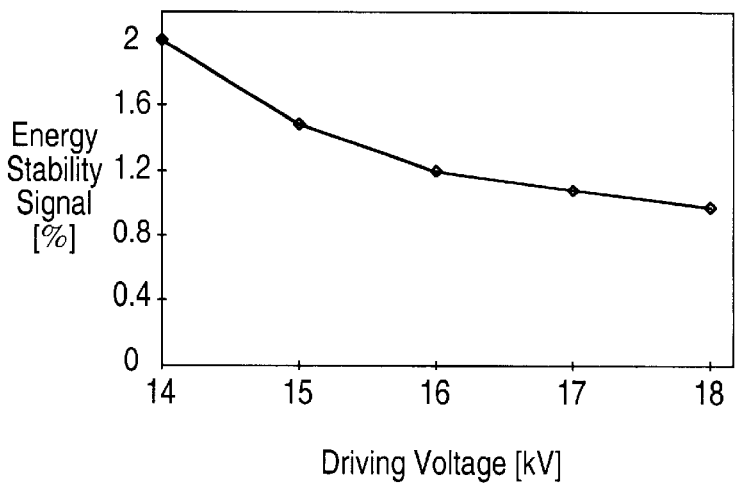
FIG. 11 is a graph of output pulse energy stability versus driving voltage of an excimer or molecular laser operating at constant output pulse energy.
Figure 12:
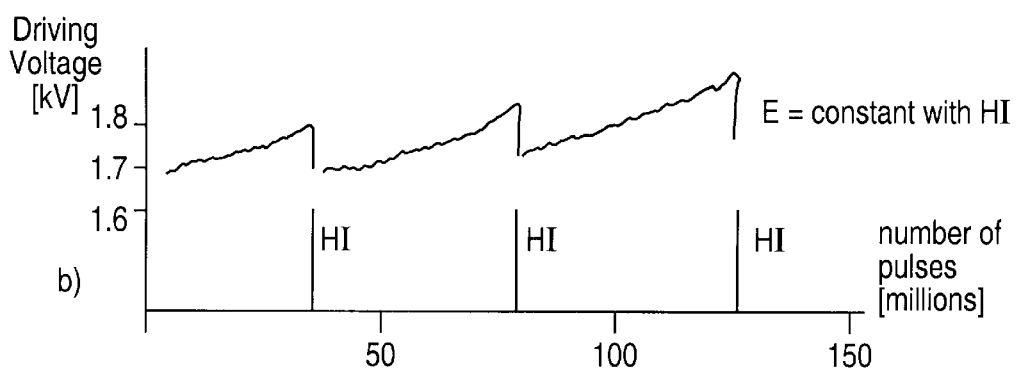
FIG. 12 illustrates the strong pronounced discontinuities in the driving voltage when large halogen partial pressures increases are rapidly effected in the discharge chamber due to halogen injections.

A comparison of FIG. 18 with the driving voltage graph of FIG. 12 shows an advantage of the present invention. In FIG. 12 the driving voltage is observed to increase steadily until a halogen injection (Hl) is performed, and is then observed to drop precipitously when the halogen is injected in a large amount in accord with conventional gas replenishment. These disturbances in the driving voltage curve of FIG. 12 occur because the intervals for the Hls are too large and the amounts of halogen injected are thus too large to prevent the disturbances. As can be deduced from FIGS. 9–11, these large driving voltage disturbances undesirable affect meaningful output beam parameters. FIG. 18, on the other hand, shows no fluctuations in the driving voltage in response to micro-halogen injections performed in accord with the present invention.

Figure 19:
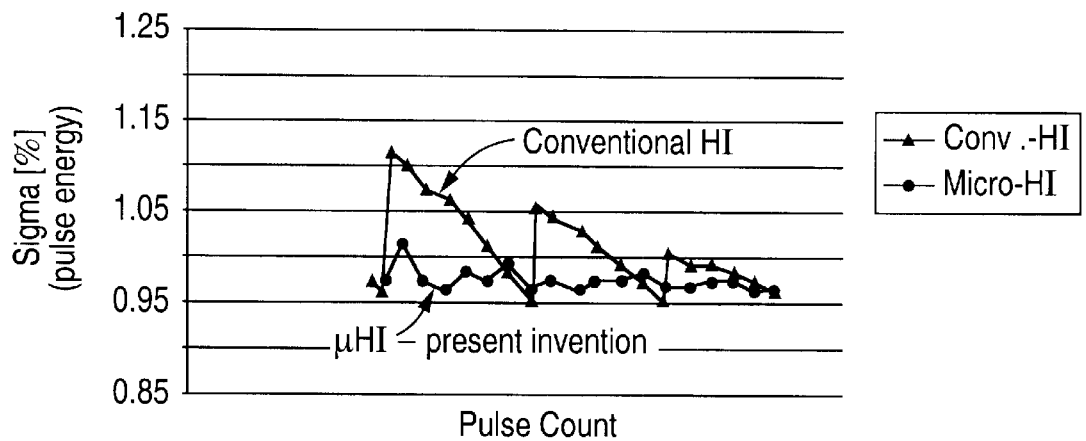
FIG. 19 is a graph of energy stability variation versus pulse count for a system in accord with a preferred embodiment.

FIG. 19 is a graph including two plots. The first plot following the darkened triangles and labelled "convention Hl" is the energy stability variation versus pulse count for a system using a conventional Hl algorithm and shows sharp discontinuities in the energy stability. For example, the first Hl is shown to produce a leap from 0.95% to 1.10% almost instantaneously in response to the Hl. The second plot following the darkened circles and labelled "μHl-present invention" is the energy stability variation versus pulse count for a system using a μHl algorithm in accord with the present invention wherein discontinuities are substantially minimized in the energy stability.

Figure 20:
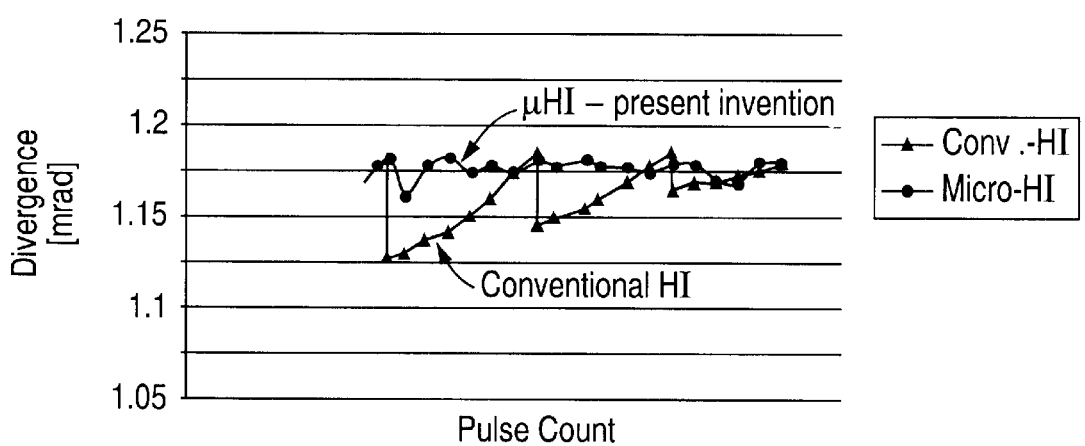
FIG. 20 is a graph of beam divergence versus pulse count for a system in accord with a preferred embodiment.

FIG. 20 is a graph also including two plots. The first plot following the darkened triangles and labelled "conventional Hl" is the beam divergence versus pulse count for a system using a conventional Hl algorithm and shows sharp discontinuities in the beam divergence. For example, the first Hl is shown to produce a sharp drop from 1.175 mrad to 1.125 mrad almost instantaneously in response to the Hl. The second plot following the darkened circles and labelled "μHl-present invention" is the beam divergence versus pulse count for a system using a μHl algorithm in accord with the present invention wherein discontinuities are substantially minimized in the beam divergence.

The expert system can use a different kind of shot counter, e.g., N(MGR) and/or N(PGR) for other types of gas actions (i.e., different from the N(μHl)). MGR and PGR replace or substitute different gases of the gas mixture in the laser tube by predetermined amounts. As mentioned, MGR and PGR include a gas injection accompanied by a release of gases from the laser tube, whereas μHl do not involve a release of gases. Gas releases can be performed simply to reduce the pressure in the laser tube, as well as for expelling contaminants from the gas mixture. Unequal degradations of the individual gas components within the gas mixture are nicely compensated using MGR and PGR, and again, different numbers NI(MGR) and $N_i$(PGR) may be used for different operating modes and conditions as determined by the expert system. All of these settings, i.e., Ni(μHl), $N_i$(MGR), $N_i$(PGR) and the separately selectable portions of injections for each gas can be adapted for the aging of the laser tube, and/or the aging of the resonator optics, taking into account changing conditions of gas consumption and replenishments as the laser system components age. The amount of compensation can be pre-selected by manual settings or based on settings in the data base of the computer controlled expert system. For MGR, like μHl, the portions of injected gases amount to a few mbar total pressure increase in the laser tube (or percent only). The MGR is combined with a small pressure release of some few to 10 mbar of the pressure of the tube, preferably bringing the pressure in the tube back near to the pressure in the tube just after the last new fill.

More than one gas may be injected or replaced in the same gas action. For example, a certain amount of halogen and a certain amount of an active rare gas and/or a gas additive for an excimer laser may be injected together into the laser tube. This injection may be accompanied by a small pressure release as with MGR. Alternatively, this mixture of the halogen and rare or additive gases may simply be injected to increase the partial pressure of each gas within the discharge chamber without any accompanying release of gases.

A further exemplary gas stabilization method involves performing gas injections based on operating driving voltage values of the laser. This method can be and preferably is advantageously combined with any of the first, second and third exemplary methods. That is, the time related $t_1(\mu Hl)$, $t_2(MGR)$, $t_3(PGR)$ and the pulse and/or input electrical energy to the discharge counter-related $N_t(\mu Hl)$, $N_t(MGR)$, $N_t(PGR)$ gas actions, discussed above, are generally adjusted during operation depending on the value of the operating driving voltage, and preferably, on the operation band of the driving voltage.

Figure 21:
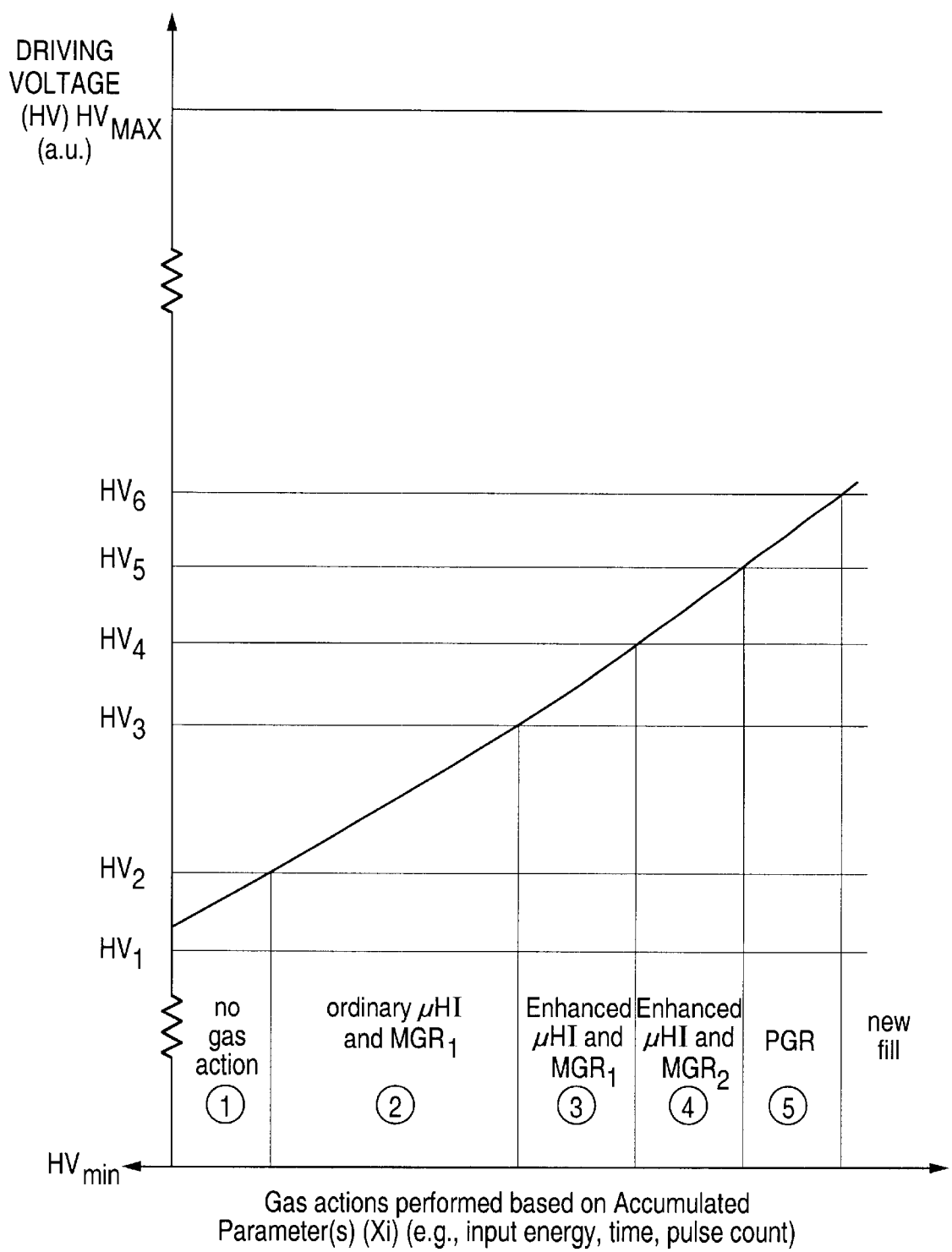
FIG. 21 is a qualitative graph of driving voltage versus pulse count also showing periodic halogen injections, mini gas replacements and partial gas replacements for a system in accord with a preferred embodiment.

Referring to FIG. 21, several driving voltage levels ($HV_i$) can be defined wherein particular gas actions are predetermined to be performed. The processor monitors the driving voltage and causes the gas supply unit to perform gas injections of varying degrees and partial and mini gas replacements of varying degrees depending on the value of the driving voltage, or which preset range the current operating driving voltage is in (y-axis of FIG. 21), based on such parameters as time, pulse count and/or total input electrical energy to the discharge, etc. (see '525 application mentioned above) (x-axis of FIG. 21).

An example in accord with the present invention is next described with reference to FIG. 21. The laser system may operate at driving voltages between $HV_{min}$ and $HV_{max}$. The actual operating minimum and maximum driving voltages are set to be in a much smaller range between $HV_1$ and $HV_6$, as illustrated by the broken ordinate axis. An advantage of the present invention is that the range $HV_1$ to $HV_6$ itself may be reduced to a very small window such that the operating voltage is never varied greatly during operation of the laser. Where this operating range itself lies between $HV_{min}$ and $HV_{max}$, i.e., the actual voltage range ( in Volts) corresponding to the range may be adjusted, e.g., to increase the lifetimes of the optical components of the resonator and the laser tube, e.g., such as by adjusting an output energy attenuating gas additive (see the '126 application).

The coordinate axis of FIG. 21 denotes the gas actions that are performed, based on one or more accumulated parameters, when the driving voltage is in each interval. The general order of performance of the gas actions is from left to right as the gas mixture ages. However, when each gas action is performed, the driving voltage is checked, and the next gas action may that corresponding to the same driving voltage range, or a different one denoted to the left or the right of that range. For example, after a PGR is performed (when it is determined that the driving voltage is above $HV_5$), the driving voltage may be reduced to between $HV_2$ and $HV_3$, and so the system would return to ordinary μHl and $MGR_1$ gas control operations.

Within the operating range between $HV_1$ and $HV_6$, several other ranges are defined. For example, when the driving voltage HV is between $HV_1$ and $HV_2$ (i.e., $HV_1 < HV < HV_2$), no gas actions are performed as there is a sufficient amount of halogen in the gas mixture. When the driving voltage is between $HV_2$ and $HV_3$ (i.e., $HV_2 < HV < HV_3$), $MGR_1$ and ordinary μHl are performed periodically based on the accumulated parameter(s) (i.e., input electrical energy to the discharge, time, and/or pulse count, etc.). This is the ordinary range of operation of the system in accord with the present invention.

When the driving voltage is between $HV_3$ and $HV_4$ (i.e., $HV_3 > HV > HV_4$), one or both of the injection amounts of the μHls and the MGRs with corresponding gas releases is increased. In this example, only the μHls are increased. Thus, the range between $HV_3$ and $HV_4$ in FIG. 21 is the range within which enhanced μHls are performed, and the same MGR amounts as in the previous range between $HV_2$ and $HV_3$ are maintained.

Enhanced μHls may differ from ordinary μHls in one or both of two ways. First, the amount per injection may be increased. Second, the interval between successive μHls may be increased.

The range between $HV_4$ and $HV_5$ (i.e., $HV_4 < HV < HV_5$) represents a new range within which one or both of the injection amounts of the μHls and the MGRs with corresponding gas releases is increased. In this example, only the MGRs are increased as compared with the range $HV_3$ to $HV_4$. Thus, an enhanced amount of halogen gas is injected (with corresponding release of gases) during each $MGR_2$ than the ordinary amount $MGR_1$ when the driving voltage is in the range between $HV_4$ and $HV_5$. Alternatively or in combination with replacing the gas in larger amounts, the mini gas replacements $MGR_2$ are performed at smaller intervals than the $MGR_1$ are performed. In each of the preferred and alternative $MGR_2$ procedures, the contaminants in the discharge chamber are reduced at smaller intervals (e.g., of accumulated input energy to the discharge, pulse count and/or time, among others) compared with the $MGR_1$ procedures that are performed at the lower driving voltage range between $HV_3$ and $HV_4$. The gHls are also preferably performed periodically in this range to recondition the gas mixture. It is noted here that several ranges wherein either or both of the amounts injected during the μHls and MGRs is adjusted may be defined each corresponding to a defined driving voltage range. Also, as mentioned above with respect to monitoring the pressure (and optionally the temperature) in the accumulator (and optionally the laser tube), the amount injected may be adjusted for each injection.

When the driving voltage is above $HV_5$ (i.e., $HV_5 < HV < HV_6$), a still greater gas replacement PGR is implemented. PGR may be used to replace up to ten percent or more of the gas mixture. Certain safeguards may be used here to prevent unwanted gas actions from occurring when, for example, the laser is being tuned. One is to allow a certain time to pass (such as several minutes) after the $HV_5$ level is crossed before the gas action is allowed to be performed, thus ensuring that the driving voltage actually increased due to gas mixture degradation. When the driving voltage goes above $HV_6$, then it is time for a new fill of the laser tube. It is noted here that the magnitudes of the driving voltages ranges shown in FIG. 21 are not necessarily drawn to scale.

Figure 22:
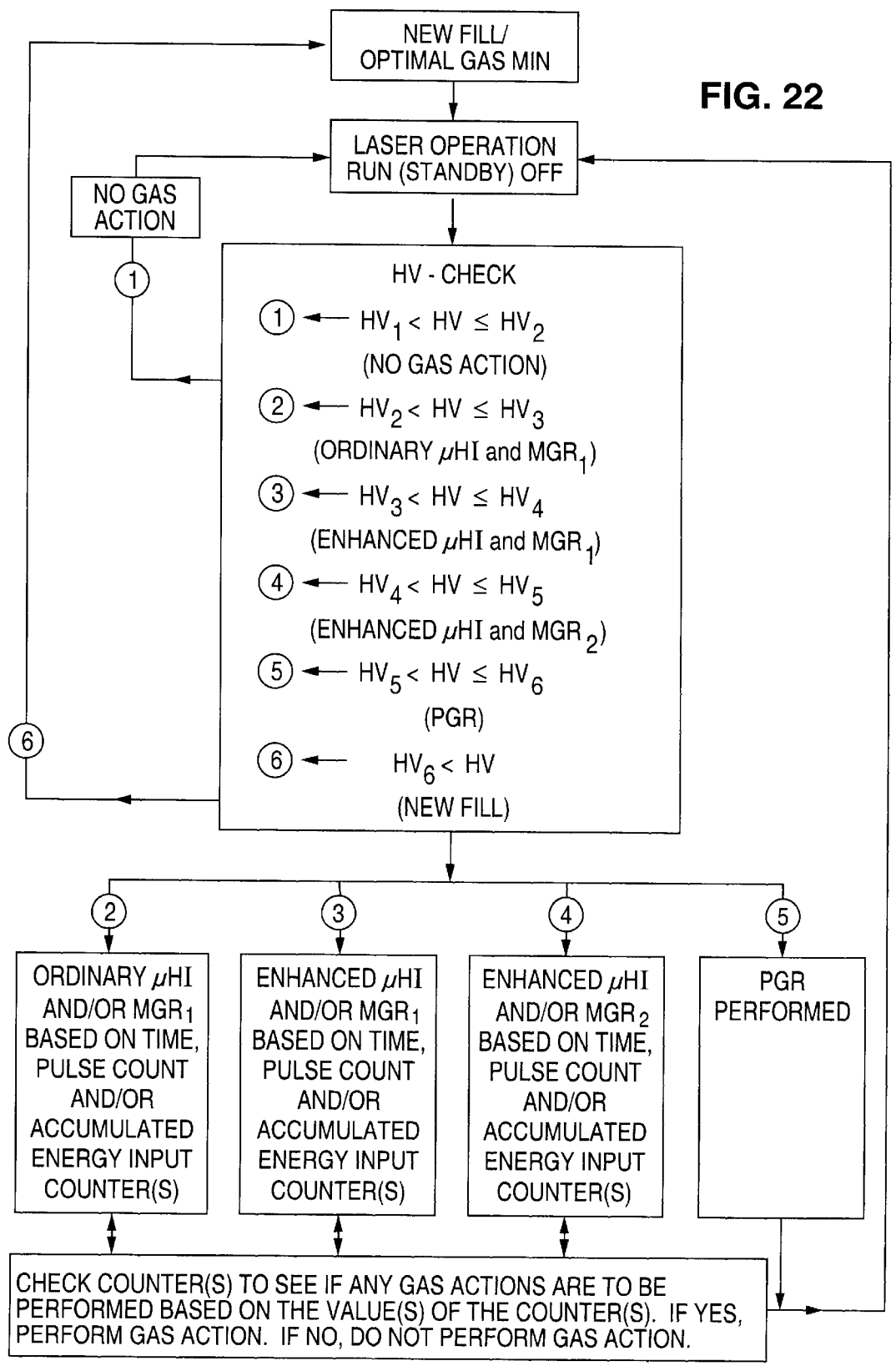
FIG. 22 is a flow diagram for performing halogen injections, mini gas replacements and partial gas replacements in accord with a preferred embodiment.

FIG. 22 is a flow diagram for performing ordinary and enhanced µHls, MGRs and PGRs in accord with the present invention and the example set forth as FIG. 21. The procedure starts with a new fill, wherein the discharge chamber is filled with an optimal gas mixture. The laser can thereafter be in operation for industrial applications, in stand-by mode or shut off completely. A driving voltage check (HV-check) is performed after the current driving voltage (HV) is measured.

The measured driving voltage (HV) is compared with predetermined values for $HV_1$ through $HV_6$. The processor determines whether HV lies between $HV_1$ and $HV_2$ (i.e., $HV_1$ <HV<$HV_2$) and thus path (1) is followed and no gas actions are to be performed and the procedure returns to the previous step. Although not shown, if the HV lies below $HV_1$, then a procedure may be followed to decrease the halogen concentration in the laser tube, such as by releasing some laser gas and/or injecting some buffer gas from/into the laser tube.

If the processor determines that the HV lies between $HV_2$ and $HV_3$, then the system is within the ordinary operating driving voltage band. If it is within the ordinary operating band, then path (2) is followed whereby ordinary µHls and $MGR_1$ may be performed based preferably on time, input electrical energy to the discharge and/or pulse count intervals as predetermined by the expert system based on operating conditions. Again each gas action may be adjusted depending on the calculated partial pressure or number of halogen molecules in the laser tube, as described above.

The µHls and $MGR_1$ performed when path (2) is followed may be determined in accordance with any method set forth in U.S. patent application Ser. No. 09/167,653, already incorporated by reference. If HV is not within the ordinary operating band, then it is determined whether HV lies below $HV_2$ (i.e., HV<$HV_2$). If HV is below $HV_2$, then path (2) is followed and no gas actions are performed.

If HV lies between $HV_3$ and $HV_4$ (i.e., $HV_3$ <HV<$HV_4$), then path (3) is followed and enhanced µHl and $MGR_1$ may be performed again based on the value or values of the time, pulse count and/or applied electrical energy to the discharge counter(s) being used. The precise amounts and compositions of gases that are injected and those that are released are preferably determined by the expert system and will depend on operating conditions.

If HV lies between $HV_4$ and $HV_5$ (i.e., $HV_4$ <HV<$HV_5$), then path (4) is followed and enhanced µHl and $MGR_2$ may be performed depending on checking the values of the counters. Again, the precise amounts and compositions of gases that are injected and those that are released are preferably determined by the expert system and will depend on operating conditions.

If HV lies between $HV_5$ and $HV_6$ (i.e., $HV_5$ <HV<$HV_6$), then PGR is performed. If HV lies above $HV_6$ (i.e., $HV_6$ <HV), then a new fill is performed.

After any of paths (2)–(5) is followed and the corresponding gas actions are performed, and preferably after a specific settling time, the method returns to the step of determining the operating mode of the laser and measuring and comparing HV again with the predetermined HV levels $HV_1$ through $HV_6$.

The setting of all of these different driving voltage levels and time, applied electrical energy to the discharge and/or pulse count schedules can be done individually or can refer to the computer controlled data base where they are stored for different operation conditions. The operation of the laser at different HV-levels under different operation conditions such as continuous pulsing or burst mode may be taken into consideration.

Figure 23:
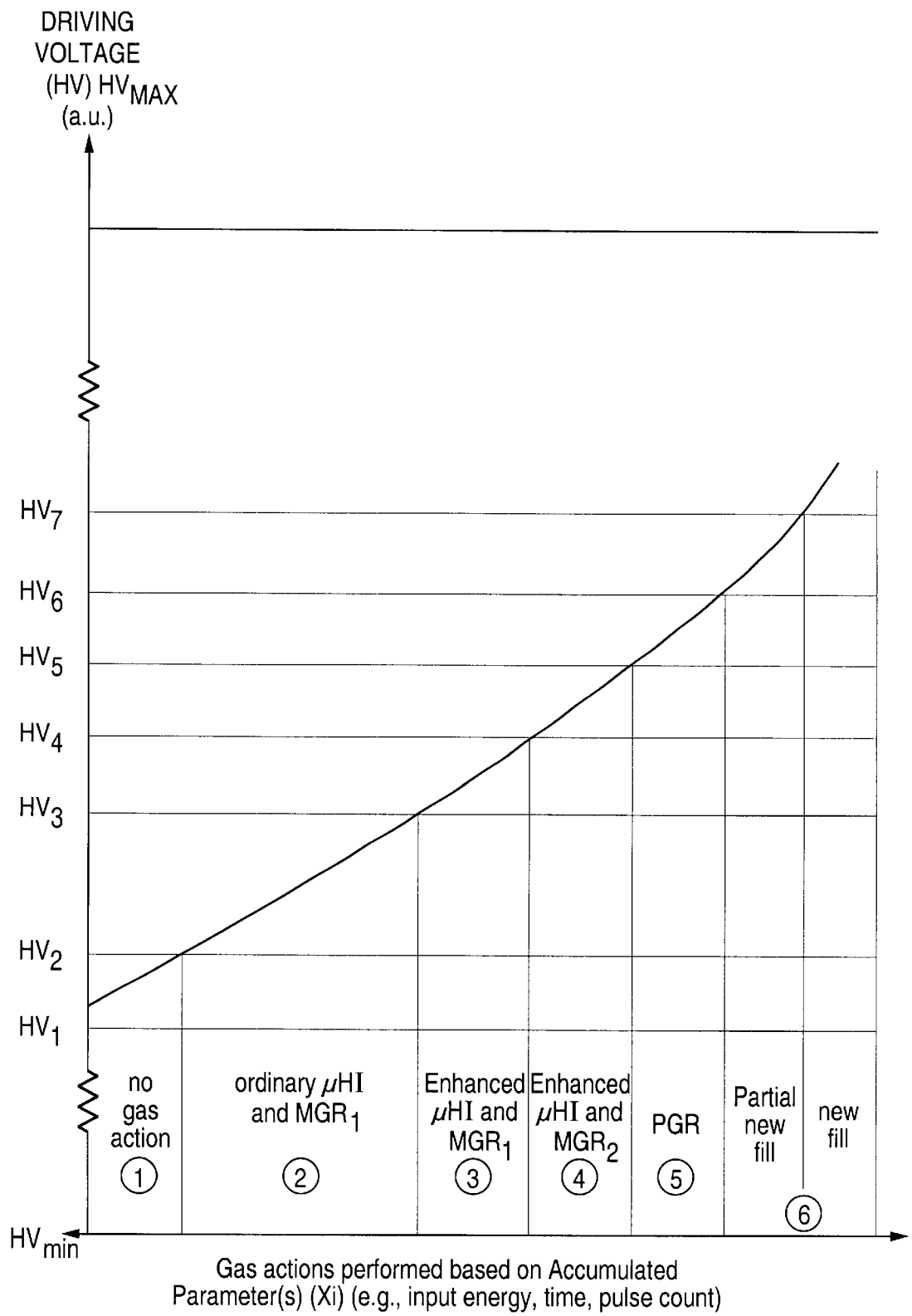
FIG. 23 is a further qualitative graph of driving voltage versus pulse count also showing periodic halogen injections, mini gas replacements and partial gas replacements for a system in accord with a preferred embodiment.
Figure 24:
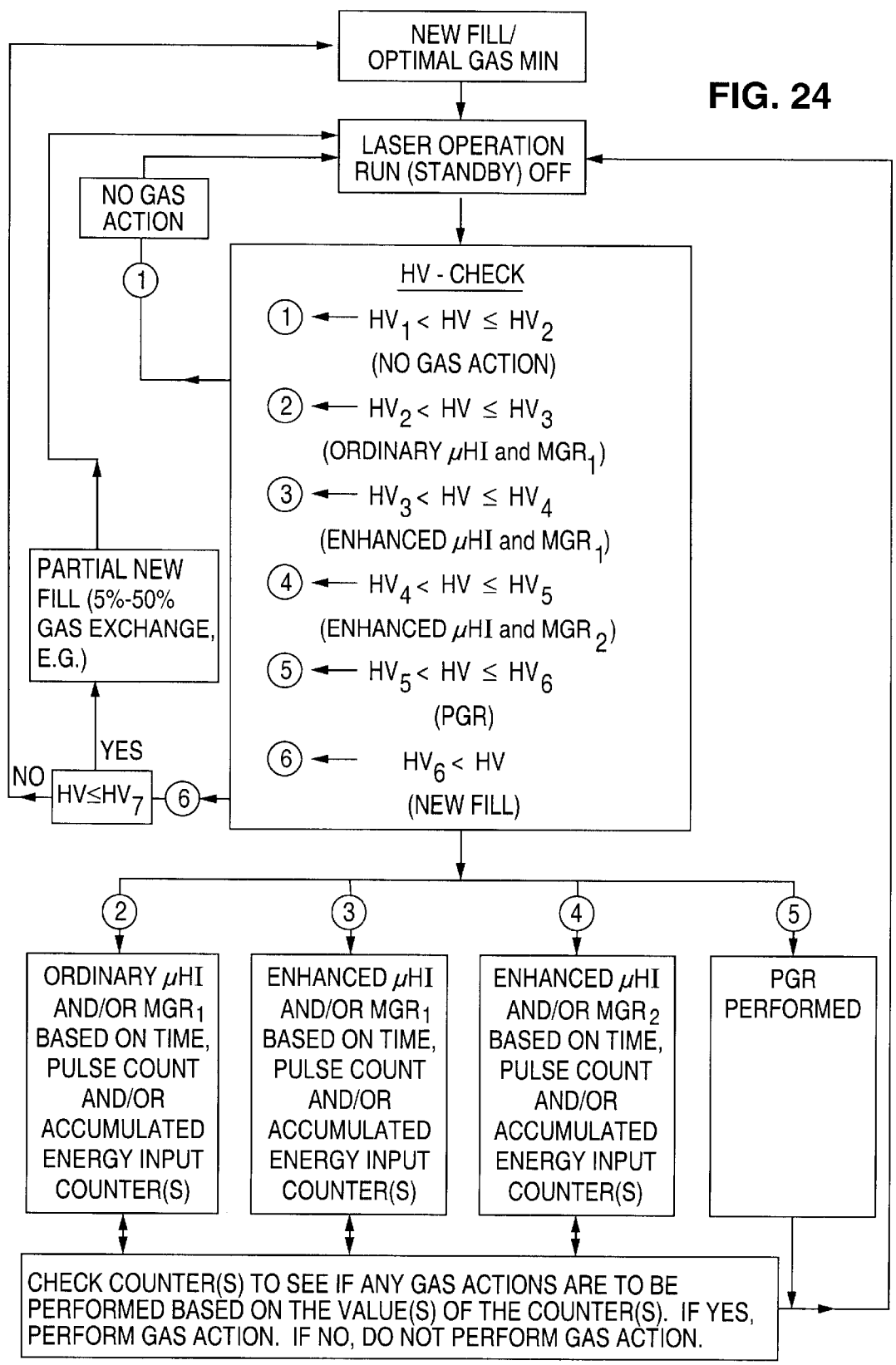
FIG. 24 is a further flow diagram for performing halogen injections, mini gas replacements and partial gas replacements in accord with a preferred embodiment.

In another preferred embodiment, a partial new fill procedure may be performed according to FIGS. 23 and 24. As shown in FIG. 23, an additional HV range is established which lies above the PGR range 5 and yet below an additional threshold value $HV_7$. The remainder of the graph shown in FIG. 23 is preferably the same as that shown in FIG. 21, and the discussion of the other ranges 1–5 will not be repeated here.

When the processor determines that the high voltage is above $HV_6$, then either a new fill or a partial new fill will be performed depending on whether the high voltage is at or below $HV_7$ wherein a partial new fill is to be performed, or is above $HV_7$, wherein a total new fill is performed. When a total new fill is performed, substantially 100% of the gas mixture is emptied from the discharge chamber and a totally fresh gas mixture is introduced into the laser chamber. However, when a partial new fill is performed, only a fraction (5% to 70% or around 0.15 bar to 2 bar, as examples) of the total gas mixture is released. More particularly preferred amounts would be between 20% and 50% or 0.6 bar to 1.5 bar. A specifically preferred amount would around 1 bar or around 30% of the gas mixture. Experiments have shown that implementing a partial new fill procedure wherein 1 bar is exchanged increases the gas lifetime by as much as five times over now having the procedure.

The amount that may be released is an amount up to which a substantial duration of time is used to get the gas out with a pump, and so the amount may be more than 50%, and yet may take substantially less time than a total new fill. Thus, a partial new fill procedure has the advantage that a large amount of aged gas is exchanged with fresh gas in a short amount of time, thus increasing wafer throughput when the laser is being used in lithographic applications, for example.

Referring now to FIG. 24, the flow chart is the same as that shown in FIG. 22, except that when the processor determines that the high voltage is above $HV_6$, an additional determination is made whether the high voltage is at or below $HV_7$. If the answer is yes, i.e., that the high voltage is at below $HV_7$, then a partial new fill is initiated, whereby less than substantially 100% of the gas mixture is taken out of the discharge chamber and replaced with fresh gas. Advantageously, the system is only taken offline for a short time compared with performing a total new fill. If the answer is no, i.e., that the high voltage is above $HV_7$, then a new fill is performed just as described above with respect to FIG. 22. As mentioned, experiments have shown that the gas lifetime can be improved by as much as five times before the new fill range would be reached when the partial new fill procedure is implemented.

It is to be understood that a system not using all of the ranges 1–6 and the new fill/partial new fill procedures of range 6 may be advantageously implemented. For example, in FIG. 23, a system that uses only a single one of the ranges with the partial new fill and new fill may be used, and the gas lifetime improved. With some ranges removed, the partial new fill range may be moved to a lower threshold high voltage. Even according to FIG. 21, one or more of the ranges may not be implemented, and the system may still improve the performance of the laser system. It is preferred that all of the ranges and corresponding gas actions be used for optimum laser system performance.

The combination of all of these different kinds of gas control and replenishment mechanisms involves harmonizing many factors and variables. Combined with the expert system and database, the processor controlled laser system of the present invention offers an extended gas lifetime before a new fill is necessary. In principle, bringing down the laser system for new fill might be totally prevented. The lifetime of the laser system would then depend on scheduled maintenance intervals determined by other laser components such as those for laser tube window or other optical components exchange. Again, as mentioned above with reference to the '126 application, even the lifetimes of the laser tube and resonator components may be increased to increase the intervals between downtime periods.

The above described gas replenishment procedures may be combined with cryogenic or electrostatic gas purification techniques, whereby contaminants such as rare gas fluorides, i.e., $AF_n$ molecules, where A=Kr, Ar or Xe and n=2, 4 or 6) or other contaminants as mentioned above are removed from the gas mixture. For this purpose, U.S. Pat. Nos. 4,534,034, 5,001,721, 5,111,473, 5,136,605 and 5,430,752 are hereby incorporated by reference into the present application. Standard methods typically include using a cold trap to freeze out contaminants before recycling the gas back into the discharge chamber.

Some of the contaminants being frozen out are molecular combinations of active gases such as the active rare and halogen gases of excimer lasers. Thus, a significant amount of these important laser gases is removed from gas mixture in the discharge chamber. The result is a rapid decrease in rare and halogen gas concentrations undesirably affecting output beam parameters.

In summary, the present invention provides a method and procedure for stabilizing an original or optimal gas composition of a gas discharge laser, and particularly an excimer or molecular fluorine ($F_2$) laser. During a long period of operation of the laser in a running or stand-by mode, the depletion of the laser gas is continuously monitored by monitoring and controlling the high voltage, laser pulse shape, ASE, elapsed time after new fill or other additional laser parameters some of which have been set forth above, in addition to accumulated electrical energy applied to the discharge, time and/or pulse count. According to a database of known histories and trends of key operating parameters for various lasers operating under various conditions, a processor controlled procedure is applied to replenish the gas degradation. The stabilization process involves using a number of tiny gas actions (micro injections) performed preferably based on specified time, driving voltage change, input electrical energy to the discharge and/or shot count intervals, a combination thereof or some other interval relating to a parameter which changes with a known relationship to the gas mixture degradation. A careful combination of $\mu$HIs and MGRs of various amounts, and PGRs, are used to effect very nearly complete stabilization of the laser gas mixture over a potentially unlimited duration. Most importantly, the gas actions described herein do not disturb meaningful output beam parameters or operation of the laser, because they are smooth and controlled based on an expert system comprising myriad operating conditions of the laser system. Thus, the laser can operate without interruption during the gas replenishment actions and industrial processing can be performed with high efficiency.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof.

In addition, in the method claims that follow, the operations have been ordered in selected typographical sequences. However, the sequences have been selected and so ordered for typographical convenience and are not intended to imply any particular order for performing the operations, except for those claims wherein a particular ordering of steps is expressly set forth or understood by one of ordinary skill in the art as being necessary.

What is claimed is:

1. A gas discharge laser system, comprising:
    a discharge chamber containing a laser gas mixture including a constituent gas which is subject to depletion;
    a plurality of electrodes connected to a power supply circuit for providing a driving voltage as a pulsed discharge to energize said laser gas mixture;
    a resonator surrounding said discharge chamber for generating a pulsed laser beam;
    a gas supply unit connected to said discharge chamber including a compartment valve-coupled between gas supply lines and the discharge chamber; and
    a processor for controlling gaseous flow between said gas supply unit and said discharge chamber,
    wherein said gas supply unit and said processor are configured to permit between 0.0001 mbar and 0.2 mbar of said constituent gas to inject into said discharge chamber at selected intervals, and
    wherein an amount of constituent gas injected is varied based on a calculated amount of constituent gas injected in a previous injection, and
    wherein said calculated amount of constituent gas injected in said previous injection is determined based on an amount of said constituent gas known to be in the compartment prior to said previous injection.

2. The laser system of claim 1, wherein said calculated amount of said constituent gas in the gas mixture is based on a measured pressure in said compartment from which constituent gas was previously injected.

3. The laser system of claim 2, wherein said calculated amount is also based on measured temperatures in said compartment and said discharge chamber.

4. A gas discharge laser system, comprising:
    a discharge chamber containing a laser gas mixture including a constituent gas which is subject to depletion;
    a plurality of electrodes connected to a power supply circuit for providing a driving voltage as a pulsed discharge to energize said laser gas mixture;
    a resonator surrounding said discharge chamber for generating a pulsed laser beam;
    a gas supply unit connected to said discharge chamber including a compartment valve-coupled between gas supply lines and the discharge chamber; and
    a processor for controlling gaseous flow between said gas supply unit and said discharge chamber,
    wherein said gas supply unit and said processor are configured to permit between 0.0001 mbar and 0.2 mbar of said constituent gas to inject into said discharge chamber at selected intervals, and
    wherein said intervals are varied based on a calculated amount of constituent gas injected in a previous injection, and wherein said calculated amount of constituent gas injected in said previous injection is determined based on an amount of said constituent gas known to be in the compartment prior to said previous injection.

5. The laser system of claim 4, wherein said calculated amount of said constituent gas in the gas mixture is based on a measured pressure in said compartment from which constituent gas was previously injected.

6. The laser system of claim 5, wherein said calculated amount is also based on measured temperatures in said compartment and said discharge chamber.

7. A method for controlling a composition of a gas mixture within a discharge chamber of a gas discharge laser system, comprising the steps of:

monitoring a parameter indicative of the concentration of a constituent gas of the gas mixture;

determining a next amount of constituent gas between 0.0001 mbar and 0.2 mbar to be injected into said discharge chamber based on a calculated amount of said constituent gas injected in a previous injection, wherein said calculated amount of constituent gas injected in said previous injection is determined based on an amount of said constituent gas known to be in a compartment disposed between gas supply lines and the discharge chamber prior to said previous injection; and injecting said next amount of said constituent gas into said discharge chamber at selected interval amounts of said second parameter.

8. The method of claim 7, wherein said next amount of said constituent gas is between 0.001 mbar and 0.02 mbar.

9. The method of claim 8, further comprising the step of monitoring an input driving voltage of a pulse power circuit of the laser, and determining said amount of constituent gas based further on a value of said input driving voltage.

10. The method of claim 8, further comprising the step of measuring a pressure within said compartment from which constituent gas was previously injected, and wherein said calculated amount of said constituent gas in the gas mixture is based on the measured pressure in the compartment from which constituent gas was previously injected.

11. The method of claim 10, further comprising the step of measuring a temperature in said compartment and a temperature in said discharge chamber, and wherein said calculated amount is also based on the measured temperatures in said compartment and said discharge chamber.

12. A method for controlling a composition of a gas mixture within a discharge chamber of a gas discharge laser system, comprising the steps of:

monitoring a parameter indicative of the concentration of a constituent gas of the gas mixture;

determining an interval value of said parameter between which injections of the constituent gas between 0.0001 mbar and 0.2 mbar into said discharge chamber are performed, said interval value being based on a calculated amount of said constituent gas injected in a previous injection, wherein said calculated amount of constituent gas injected in said previous injection is determined based on an amount of said constituent gas known to be in a compartment disposed between gas supply lines and the discharge chamber prior to said previous injection; and injecting said constituent gas into said discharge chamber at said interval value of said parameter.

13. The method of claim 12, wherein said injection of said constituent gas is between 0.001 mbar and 0.02 mbar.

14. The method of claim 13, further comprising the step of monitoring an input driving voltage of a pulse power circuit of the laser, and determining said interval value based further on a value of said driving voltage.

15. The method of claim 14, further comprising the step of measuring a pressure in the compartment from which constituent gas was previously injected, and wherein said calculated amount of said constituent gas in the gas mixture is based on said measured pressure in said compartment from which constituent gas was previously injected.

16. A gas discharge laser system, comprising:

a discharge chamber containing a laser gas mixture including a constituent gas which is subject to depletion;

a plurality of electrodes connected to a power supply circuit for providing a driving voltage as a pulsed discharge to energize said laser gas mixture;

a resonator surrounding said discharge chamber for generating a pulsed laser beam;

a gas supply unit connected to said discharge chamber including a compartment valve-coupled between gas supply lines and the discharge chamber; and a processor for controlling gaseous flow between said gas supply unit and said discharge chamber, wherein said gas supply unit and said processor are configured to permit a quantity less than 0.1 mbar of said constituent gas to inject into said discharge chamber at selected intervals, and wherein an amount of constituent gas injected is varied based on a calculated amount of constituent gas injected in a previous injection, and wherein said calculated amount of constituent gas injected in said previous injection is determined based on an amount of said constituent gas known to be in the compartment prior to said previous injection.

17. A gas discharge laser system, comprising:

a discharge chamber containing a laser gas mixture including a constituent gas which is subject to depletion;

a pluratlity of electrodes connected to a power supply circuit for providing a driving voltage as a pulsed discharge to energize said laser gas mixture;

a resonator surrounding said discharge chamber for generating a pulsed laser beam;

a gas supply unit connected to said discharge chamber including a compartment valve-coupled between gas supply lines and the discharge chamber; and a processor for controlling gaseous flow between said gas supply unit and said discharge chamber, wherein said gas supply unit and said processor are configured to permit a quantity less than 0.1 mbar of said constituent gas to inject into said discharge chamber at selected intervals, and wherein said intervals are varied based on a calculated amount of constituent gas injected in a previous injection, and wherein said calculated amount of constituent gas injected in said previous injection is determined based on an amount of said constituent gas known to be in the compartment prior to said previous injection.

18. A method for controlling a composition of a gas mixture within a discharge chamber of a gas discharge laser system, comprising the steps of:

monitoring a parameter indicative of the concentration of a constituent gas of the gas mixture;

determining a next amount of constituent gas less than 0.1 mbar to be injected into said discharge chamber based on a calculated amount of said constituent gas injected in a previous injection, wherein said calculated amount of constituent gas injected in said previous injection is determined based on an amount of said constituent gas known to be in a compartment disposed between gas supply lines and the discharge chamber prior to said previous injection; and injecting said next amount of said constituent gas into said discharge chamber at selected interval amounts of said second parameter.

19. A method for controlling a composition of a gas mixture within a discharge chamber of a gas discharge laser system, comprising the steps of:

monitoring a parameter indicative of the concentration of a constituent gas of the gas mixture;

determining an interval value of said parameter between which injections of the constituent gas in amounts less than 0.1 mbar into said discharge chamber are performed, said interval value being based on a calculated amount of said constituent gas injected in a previous injection, wherein said calculated amount of constituent gas injected in said previous injection is determined based on an amount of said constituent gas known to be in a compartment disposed between gas supply lines and the discharge chamber prior to said previous injection; and injecting said constituent gas into said discharge chamber at said interval value of said parameter.

20. A gas discharge laser system, comprising:

a discharge chamber containing a laser gas mixture including a halogen gas which is subject to depletion;

a plurality of electrodes connnected to a power supply circuit for providing a driving voltage as a pulsed discharge to energize said laser gas mixture;

a resonator surrounding said discharge chamber for generating a pulsed laser beam;

a gas supply unit connected to said discharge chamber including a compartment valve-coupled between gas supply lines and the discharge chamber; and a processor for controlling gaseous flow between said gas supply unit and said discharge chamber, wherein said gas supply unit and said processor are configured to permit a quantity less than 5% of said halogen gas in said discharge chamber to inject into said discharge chamber at selected intervals, and wherein an amount of halogen gas injected is varied based on a calculated amount of constituent gas injected in a previous injection, and wherein said calculated amount of constituent gas injected in said previous injection is determined based on an amount of said constituent gas known to be in the compartment prior to said previous injection.

21. A gas discharge laser system, comprising:

a discharge chamber containing a laser gas mixture including a halogen gas which is subject to depletion;

a plurality of electrodes connected to a power supply circuit for providing a driving voltage as a pulsed discharge to energize said laser gas mixture;

a resonator surrounding said discharge chamber for generating a pulsed laser beam;

a gas supply unit connected to said discharge chamber including a compartment valve-coupled between gas supply lines and the discharge chamber; and a processor for controlling gaseous flow between said gas supply unit and said discharge chamber, wherein said gas supply unit and said processor are configured to permit a quantity less than 5% of said halogen gas in said discharge chamber to inject into said discharge chamber at selected intervals, and wherein said intervals are varied based on a calculated amount of halogen gas injected in a previous injection, and wherein said calculated amount of constituent gas injected inside previous injection is determined based on an amount of said constituent gas known to be in the compartment prior to said previous injection.

22. A method for controlling a composition of a gas mixture within a discharge chamber of a gas discharge laser system, comprising the steps of:

monitoring a parameter indicative of the concentration of a halogen gas of the gas mixture;

determining a next amount of halogen gas less than 5% of said halogen gas in said discharge chamber to be injected into said discharge chamber based on a calculated amount of said halogen gas injected in a previous injection, wherein said calculated amount of constituent gas injected in said previous injection is determined based on an amount of said constituent gas known to be in a compartment disposed between gas supply lines and the discharge chamber prior to said previous injection; and injecting said next amount of said halogen gas into said discharge chamber at selected interval amounts of said second parameter.

23. A method for controlling a composition of a gas mixture within a discharge chamber of a gas discharge laser system, comprising the steps of:

monitoring a parameter indicative of the concentration of a halogen gas of the gas mixture;

determining an interval value of said parameter between which injections into said discharge chamber of the halogen gas in amounts less than 5% of said halogen gas in said discharge chamber are performed, said interval value being based on a calculated amount of said halogen gas injected in a previous injection, wherein said calculated amount of constituent gas injected in said previous injection is determined based on an amount of said constituent gas known to be in a compartment disposed between gas supply lines and the discharge chamber prior to said previous injection; and injecting said halogen gas into said discharge chamber at said interval value of said parameter.

* * * * *